US008068102B2

(12) United States Patent
Yoshida et al.

(10) Patent No.: US 8,068,102 B2
(45) Date of Patent: Nov. 29, 2011

(54) DRIVE VOLTAGE SUPPLY CIRCUIT

(75) Inventors: Seiya Yoshida, Osaka (JP); Hiroki Matsunaga, Osaka (JP); Akihiro Maejima, Osaka (JP); Jinsaku Kaneda, Osaka (JP); Hiroshi Ando, Osaka (JP)

(73) Assignee: Panasonic Corporation, Osaka (JP)

( * ) Notice: Subject to any disclaimer, the term of this patent is extended or adjusted under 35 U.S.C. 154(b) by 1223 days.

(21) Appl. No.: 11/802,635

(22) Filed: May 24, 2007

(65) Prior Publication Data

US 2007/0273412 A1 Nov. 29, 2007

(30) Foreign Application Priority Data

May 25, 2006 (JP) ................................ 2006-144883
Apr. 12, 2007 (JP) ................................ 2007-104720

(51) Int. Cl.
*G06F 3/038* (2006.01)
*H03L 5/00* (2006.01)

(52) U.S. Cl. .......... 345/204; 345/63; 327/333; 327/108; 323/271

(58) Field of Classification Search ............... 345/60–72
See application file for complete search history.

(56) References Cited

U.S. PATENT DOCUMENTS 5,781,001 A * 7/1998 Takemoto .................... 323/267
7,528,803 B2 5/2009 Lee et al.

FOREIGN PATENT DOCUMENTS

JP 2001-024491 A 1/2001
JP 2005-129121 5/2005

OTHER PUBLICATIONS

Lin, H.C., Diode Operation of a Transistor in Functional Blocks, May 1963, IEEE Transactions on Electron Devices, vol. 10, issue 3, pp. 189-194.*
Machine translation of JP-2005-129121A downloaded from AIPN (http://dossier.ipdl.inpit.go.jp/text_trans.html) Mar. 25, 2011.*
Chinese Office Action, w/ English translation thereof, issued in Chinese Patent Application No. CN 200710105076.0 dated Apr. 14, 2010.

* cited by examiner

*Primary Examiner* — Richard Hjerpe
*Assistant Examiner* — Dorothy Harris
(74) *Attorney, Agent, or Firm* — McDermott Will & Emery LLP

(57) ABSTRACT

A drive voltage supply circuit has a first wire line, a second wire line, a first drive circuit, a plurality of second drive circuits, a control circuit for driving the first drive circuit and the plurality of second drive circuits, and an impedance element connected between the first wire line and each of output terminals.

4 Claims, 14 Drawing Sheets

DRIVE VOLTAGE SUPPLY CIRCUIT

BACKGROUND OF THE INVENTION

The present invention relates to a semiconductor integrated circuit and, more particularly, to a drive circuit used in a multi-channel semiconductor integrated circuit for driving a capacitive load such as a plasma display.

A conventional drive voltage supply circuit used in a multi-channel semiconductor integrated circuit will be described with reference to the drawings (see, e.g., Japanese Patent Application No. 2003-362063 (FIG. 4)).

FIG. 12 shows a structure of the conventional drive voltage supply circuit in a multi-channel semiconductor integrated circuit.

The drive voltage supply circuit shown in FIG. 12 comprises: a shift register 1 consisting of a plurality of latch circuits 1*a*; a gate circuit 2; a level shift circuit 4 connected to a power source terminal 9 and outputs a signal having the same polarity as an input thereto and a voltage obtained by shifting the voltage of the input; a high-side drive circuit 7 composed of a high-side transistor 3 controlled by the level shift circuit 4; low-side drive circuits 8 each connected between a common connection terminal 13 and a GND terminal 10 and composed of a low-side transistor 5 and a diode 6; and load capacitances 14 connected between the respective output terminals 11 of the low-side drive circuits 8 and a GND terminal. In FIG. 10, parasitic diodes 3*a* and 5*a* are shown individually for the high-side transistor 3 and the low-side transistors 5.

As shown in FIG. 12, it is assumed that, when a specified one of the plurality of low-side drive circuits 8 is mentioned, e.g., when the first one of the low-side drive circuits is mentioned, it will be hereinafter denoted as "low-side drive circuit 8(1)" and, when all or any of the low-side drive circuits are mentioned, they will be hereinafter denoted as the "low-side drive circuits 8". The same notation shall apply to the low-side transistors 5, the diodes 6, the output terminals 11, the load capacitances 14, latch circuits 1*a*, and the parasitic diodes 3*a* and 5*a* which are the components of the low-side drive circuits 8.

Outputs Q which are sequentially outputted from the latch circuits 1*a*(1) to 1*a*(4*n*−3) each composing the shift register 1 are supplied to the gate circuit 2. An output signal from the gate circuit 2 is supplied to the level shift circuit 4. An output signal from the level shift circuit 4 controls the high-side transistor 3. On the other hand, the outputs Q which are sequentially outputted from the latch circuits 1*a*(1) to 1*a*(4*n*−3) control the low-side transistors 5(1) to 5(4*n*−3). By thus controlling the high-side transistor 3 and the low-side transistors 5, the states of the output terminals 11 are sequentially switched.

The conventional drive voltage supply circuit used in a multi-channel semiconductor integrated circuit has the structure in which the high-side transistor is shared by the plurality of low-side transistors. Accordingly, when the low-side transistor connected to a given one of the output terminals is ON, even though the low-side transistors connected to the other output terminals are OFF, the high-side transistor is turned OFF for the purpose of preventing a through current from flowing between the power source terminal and the GND terminal. In this manner, a path along which charge propagates is cut off by producing a high impedance state (hereinafter referred to as HIZ) so that the H level is maintained as a signal level at each of the output terminals. However, there has been a problem that, because of the HIZ state, an incoming disturbance causes an oscillation in the potential at any of the output terminals and the H level cannot be maintained any more.

A description will be given herein below to the problem of the oscillation in the potential at the output terminal caused by the disturbance in the HIZ state by using a case with a plasma display panel (hereinafter referred to as the PDP) as an example.

As shown in FIG. 13, the PDP comprises three electrodes which are a scan electrode 200, a sustain electrode 201, and a data electrode 202. Because each of the electrodes 200 to 202 is covered with a dielectric material, when viewed equivalently, it follows that capacitances 203, 204, and 205 are connected respectively between the electrodes 200 and 201, between the electrodes 201 and 202, and between the electrodes 200 and 202, as shown in FIG. 13. Accordingly, the output load of each of the drivers of the PDP becomes a capacitive load.

As shown in FIG. 13, a high-side transistor 208 and a low-side transistor 209 are connected between a power source terminal 206 and a GND terminal 207. When the low-side transistor 209 is OFF, the high-side transistor 208 is turned ON, whereby a H-level voltage is outputted to the scan electrode 200. Conversely, when the low-side transistor 209 is ON, the high-side transistor 208 is turned OFF, whereby a L-level voltage is outputted to the scan electrode 200. To each of the sustain electrode 201 and the data electrode 202 also, the H-level or L-level voltage is outputted with the same structure (a high side transistor 211 and a low-side transistor 212 each provided between a power source terminal 210 and a GND terminal 217 are connected to the sustain electrode 201, while a high-side transistor 215 and a low-side transistor 216 each provided between a power-source terminal 213 and a GND terminal 214 are connected to the data electrode 202) and under the same conditions as used for the scan electrode 200. In FIG. 13, the respective parasitic diodes (208*a*, 209*a*, 211*a*, 212*a*, 215*a*, and 216*a*) of the high-side transistors (208, 211, and 215) and the low-side transistors (209, 212, and 216) are shown.

Next, as an example of a disturbance (noise) resulting from the operation of an output signal from the data electrode 202, an oscillation caused by the disturbance in the output potential at the scan electrode 200 will be described herein below.

As shown in FIG. 14, when a data waveform applied to the data electrode 202 shifts from the L level to the H level at the time t1 and shifts from the H level to the L level at the time t2, noise enters the scan electrode 200 via the capacitance 205 to cause an undesirable oscillation in the potential at the scan electrode 200. In this case, when the high-side transistor 201 is ON, there is no problem because the oscillated potential at the scan electrode 200 returns to the same H level as the potential at the power source terminal 206 in a very short period of time. However, when each of the high-side transistor 208 and the low-side transistor 209 is OFF, the scan electrode 200 is in the HIZ state so that a path along which charge propagates is cut off. As a result, the noise from the data electrode 200 that has entered the scan electrode 200 via the capacitance 205 causes the oscillation in the potential at the scan electrode 200.

For example, as shown in FIG. 14, when the potential of the scan waveform applied to the scan electrode 200 oscillates to the H side at the time t1, it oscillates only to the level of a voltage (VDDH+VD) obtained by adding a forward voltage VD equivalent to the parasitic diode 208*a* to the power source voltage at the power source terminal 206. However, when the potential at the scan electrode 200 oscillates to the L side at the time t2, it undesirably oscillates to the level of a voltage (−VD) obtained by subtracting a forward voltage VD equivalent to the parasitic diode 209*a* from the voltage (VGND=0) at the GND terminal 207. As a result, the potential at the scan electrode 200 cannot retain the H level (power source voltage) and shifts to the L level.

SUMMARY OF THE INVENTION

In view of the foregoing, it is therefore an object of the present invention to provide a drive voltage supply circuit which is used in a multi-channel semiconductor integrated circuit and allows a voltage at each of output terminals in a HIZ state to be stabilized.

To attain the object mentioned above, a drive voltage supply circuit according to a first aspect of the present invention comprises: a first wire line supplied with a first potential; a second wire line supplied with a second potential; a first drive circuit connected between the first wire line and a third wire line; a plurality of second drive circuits each connected between the second wire line and the third wire line and having a diode and a transistor which are connected in series as well as an output terminal connected to a common connection node between the diode and the transistor; a control circuit for driving the first drive circuit and the plurality of second drive circuits; and an impedance element connected between the first wire line and each of the output terminals.

In the drive voltage supply circuit according to the first aspect of the present invention, the impedance element is composed of a resistor.

A drive voltage supply circuit according to a second aspect of the present invention comprises: a first wire line supplied with a first potential; a second wire line supplied with a second potential; a first drive circuit connected between the first wire line and a third wire line; a plurality of second drive circuits each connected between the second wire line and the third wire line and having a diode and a transistor which are connected in series as well as an output terminal connected to a common connection node between the diode and the transistor; a control circuit for driving the first drive circuit and the plurality of second drive circuits; and MOS transistors connected between the first wire line and the respective output terminals and composing a current source for supplying a current to each of the output terminals.

The drive voltage supply circuit according to the second aspect of the present invention further comprises: a MOS transistor provided between the first wire line and the second wire line to perform a switching operation in a phase opposite to a phase of a signal for driving the second drive circuit.

The drive voltage supply circuit according to the second aspect of the present invention further comprises: a selection circuit for performing a switching operation using an external input to prevent a transistor composing the first drive circuit and at least one of the MOS transistors composing the current source from being simultaneously turned ON.

A drive voltage supply circuit according to a third aspect of the present invention comprises: a first wire line supplied with a first potential; a second wire line supplied with a second potential; a plurality of first drive circuits each connected to the first wire line; a plurality of second drive circuits equal in number to the first drive circuits and having respective output terminals having respective one ends connected to the first drive circuits and the respective other ends connected to the second wire line and connected individually to the respective output terminals of the first drive circuits; a control circuit for driving the plurality of first drive circuits and the plurality of second drive circuits; MOS transistors connected between the first wire line and the respective output terminals and composing a current source for supplying a current to each of the output terminals; and a selection circuit for performing a switching operation using an external input to prevent any of transistors composing the plurality of first drive circuits and any of the MOS transistors composing the current source from being simultaneously turned ON.

Since the drive voltage supply circuit according to the present invention which is used in a multi-channel semiconductor integrated circuit allows the potential at each of the output terminals to be fixed, an oscillation in the potential at any of the output terminals due to a disturbance during a HIZ period which occurs when each of a high-side transistor and low-side transistors is turned OFF can be suppressed. As a result, it is possible to supply a stable output to a capacitive load such as a PDP panel and also improve the quality of an image on the PDP panel or the like.

In addition, a protecting function during the short circuit of the terminal can be implemented by using the MOS transistor as the impedance element as a substitute for the high-side transistor in the drive voltage supply circuit according to the present invention.

DETAILED DESCRIPTION OF THE INVENTION

Figure 1:
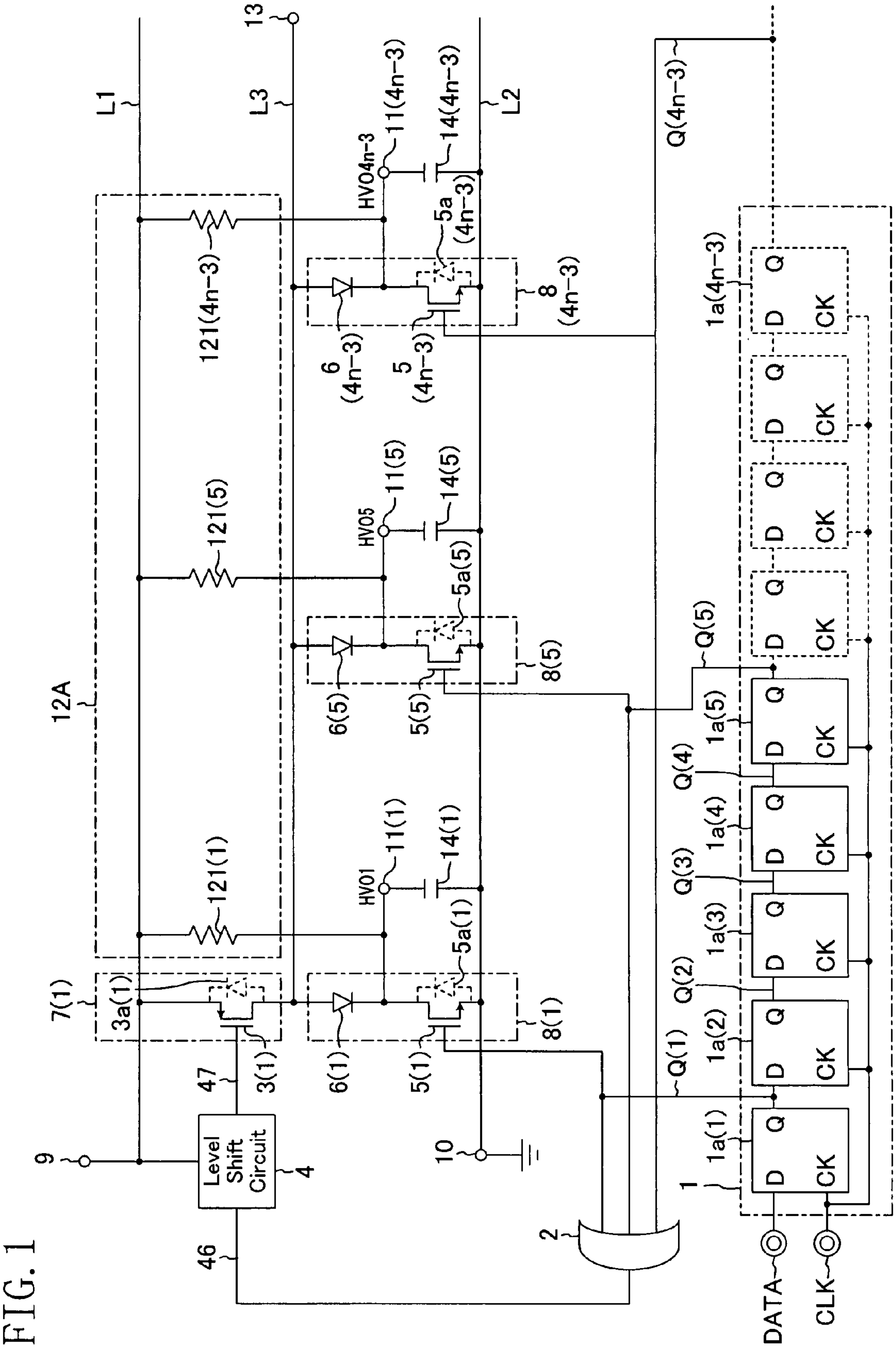
FIG. 1 is a circuit diagram showing a structure of a drive voltage supply circuit in a first embodiment of the present invention.

Referring now to the drawings, the individual embodiments of the present invention will be described herein below.

Embodiment 1

A drive voltage supply circuit according to the first embodiment of the present invention is used in a multi-channel semiconductor integrated circuit and features a structure in which resistors are provided between a power source terminal and output terminals. The structure allows a current to flow between the power source terminal and each of capacitive loads connected to the output terminals during a period other than the period in which the potentials at the output terminals are on the H level. As a result, it is possible to suppress an oscillation in the potential at each of the output terminals due to a disturbance when each of a high-side transistor and low-side transistors is OFF and a HIZ state occurs.

A specific description will be given herein below to the drive voltage supply circuit according to the first embodiment.

FIG. 1 shows a structure of the drive voltage supply circuit according to the first embodiment in a multi-channel semiconductor integrated circuit. In the drawing, n is an integer of not less than 2.

The drive-voltage supply circuit shown in FIG. 1 comprises: a shift register 1 consisting of a plurality of latch circuits 1*a*; a gate circuit 2; a level shift circuit 4; a high-side drive circuit 7 composed of a high-side transistor 3; low-side drive circuits 8 each composed of a low-side transistor 5 and a diode 6; load capacitances 14 connected to the output terminals 11 of the low-side drive circuits 8; and an impedance element 12A. In FIG. 1, parasitic diodes 3*a* and 5*a* are shown individually for the high-side transistor 3 and the low-side transistors 5.

As shown in FIG. 1, it is assumed that, when a specified one of the plurality of low-side drive circuits 8 is mentioned, e.g., when the first one of the low-side drive circuits is mentioned, it will be hereinafter denoted as "low-side drive circuit 8(1)" and, when all or any of the low-side drive circuits are mentioned, they will be hereinafter denoted as the "low-side drive circuits 8". The same notation shall apply to the low-side transistors 5, the diodes 6, the output terminals 11, the load capacitances 14, latch circuits 1*a*, and the parasitic diodes 3*a* and 5*a*.

Next, a specific description will be given to the individual components of the drive voltage supply circuit shown in FIG. 1.

The shift register 1 consists of the plurality of latch circuits 1*a* and sequentially supplies, to the gate circuit 2, a data signal DATA inputted to terminals D as output signals Q from terminals Q with a timing synchronized with a clock signal CLK inputted to terminals CK.

The gate circuit 2 receives the output signals Q from the terminals Q of the plurality of latch circuits 1*a* and supplies an input signal 46 to the level shift circuit 4.

Figure 2:
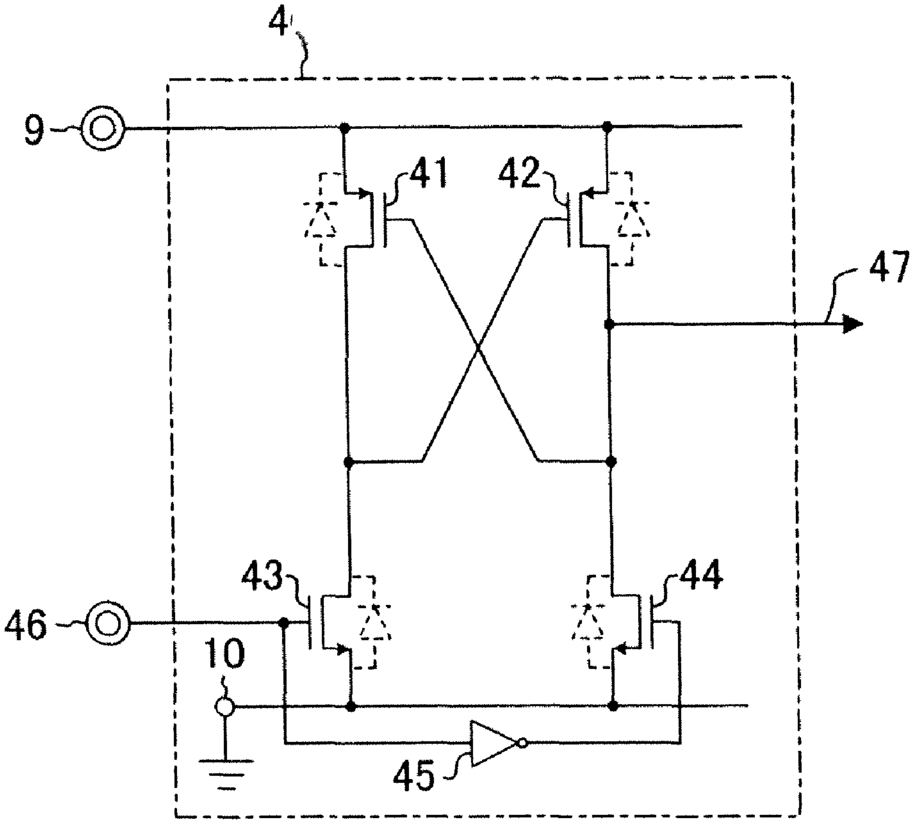
FIG. 2 is a circuit diagram showing a structure of a level shift circuit in the first embodiment.

The level shift circuit 4 is connected to a power source terminal 9 and supplies an output signal 47 having the same polarity as the input signal 46 and a voltage obtained by shifting the voltage of the input signal 46 to the high-side drive circuit 7. In a specific example of the structure of the level sift circuit 4, it is composed of a PMOS 41, a PMOS 42, an NMOS 43, an NMOS 44, and an inverter 45, as shown in FIG. 2.

The high-side drive circuit 7 is connected between a first wire line L1 supplied with a power source voltage from the power source terminal 9 and a common wire line L3 shared by the high-side drive circuit 7 and the low-side drive circuits 8. The high-side transistor 3 composing the high-side drive circuit 7 has a first terminal connected to the first wire line L1 and a second terminal connected to the common wire line L3 and is controlled by the output signal 47 from the level shift circuit 4 that has been received by the gate thereof.

Each of the low-side drive circuits 8 is connected between the common wire line L3 and a second wire line L2 connected to a GND terminal 10. The low-side transistors 5 have respective first terminals connected to the second wire lines L2 and respective second terminals connected to the cathodes of the diodes 6 and are controlled in accordance with the output signals Q from the latch circuits 1*a* that have been received by the gates thereof. The anodes of the diodes 6 are connected to the common wire line L3. The output terminals 11 are connected to the common connection nodes between the low-side transistors 5 and the diodes 6. The capacitive loads 14 are connected between the output terminals 11 and the second wire line L2. The states at the output terminals 11 are switched by the control states of the high-side transistor 3 and the low-side transistors 5.

The impedance element 12A is connected between the first wire line L1 and the output terminals 11 and composed of resistors 121 in the present embodiment.

A description will be given herein below to the operation of the drive voltage supply circuit according to the first embodiment.

Figure 3:
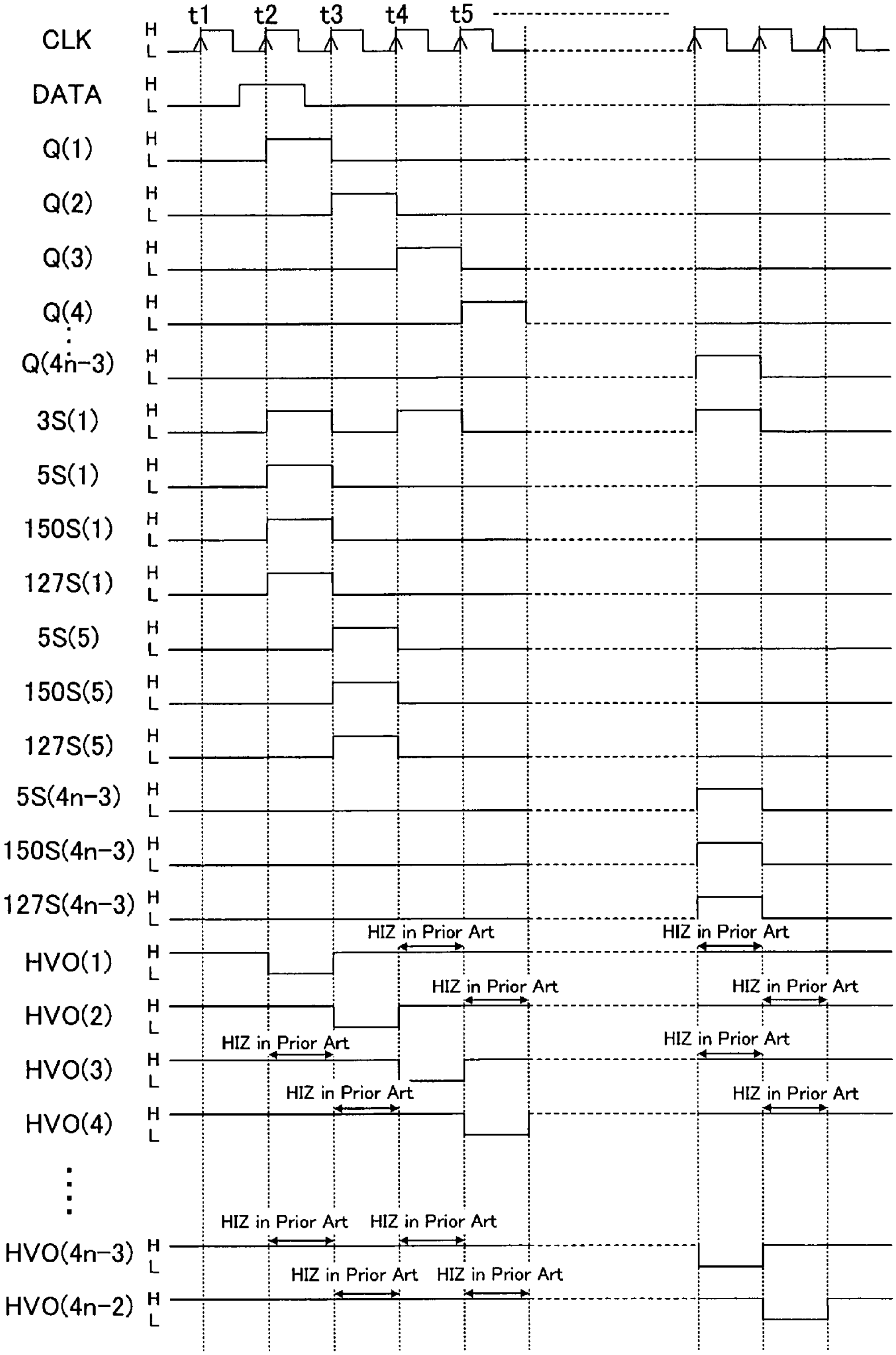
FIG. 3 is a timing chart for illustrating an operation of the drive voltage supply circuit in the first embodiment.

FIG. 3 is a timing chart for illustrating the operation of the drive voltage supply circuit according to the first embodiment. For easy description of the operation, the connection of each of the capacitive loads 14 in FIG. 1 is shown as the connection of a typical load capacitance drive circuit and different from that of a real set circuit in the PDP shown in FIG. 13.

FIG. 3 shows the clock signal CLK, the data signal DATA supplied to the terminal D of the latch circuit 1*a*(1), the output signal Q(1) from the latch circuit 1*a*(1), the output signal Q(2) from the latch circuit 1*a*(2), the output signal Q(3) from the latch circuit 1*a*(3), the output signal Q(4) from the latch circuit 1*a*(4), the output signal Q(4*n*−3) from the latch circuit 1*a*(4*n*−3), an input signal 3S(1) to the gate of the high-side transistor 3(1), an input signal 5S(1) to the gate of the low-side transistor 5(1), an input signal 5S(3) to the gate of the low-side transistor 5(5), an input signal 5S(4*n*−3) to the gate of the low-side transistor 5(4*n*−3), an output signal HVO(1) to the output terminal 11(1) of the low-side drive circuit 8(1), an output signal HVO(2) from the output terminal 11(2) not shown of the low-side drive circuit 8(2), an output signal HVO(5) from the output terminal 11(5) of the low-side drive circuit 8(3), an output signal HVO(4) from the output terminal 11(4) not shown of the low-side drive circuit 8(4), an output signal HVO(4*n*−3) from the output terminal 11(4*n*−3) of the low-side drive circuit 8(4*n*−3), and an output signal HVO(4*n*−2) from the output terminal 11(4*n*−2) not shown of the low-side drive circuit 8(4*n*−2). In FIG. 3, output signals 150S(1), 150S(5), and 150S(4*n*−3) and output signals 127S(1), 127S(5), and 127S(4*n*−3), which will be used later in the description of the third and fourth embodiments of the present invention, are also shown.

First, at the time t1, the data signal DATA is still on the L level (GND) so that the output signal Q from each of the latch circuits 1*a* corresponding to each of the high-side drive circuits 7 and each of the low-side drive circuits 8 is on the L level (GND). Accordingly, each of the low-side transistors 5 is in the OFF state and the high-side transistor 3 is in the ON state so that the output signal from each of the output terminals 11 is on the H level (power source voltage).

Next, when the data signal DATA shifts from the L level to the H level during the period between the times t1 and t2, the latch circuit 1*a*(1) supplies the data signal DATA on the H level to the gate circuit 2 and to the low-side transistor 5(1) with the timing at which the time t2 is reached, while supplying it to the terminal D of the latch circuit 1*a*(2).

On receiving the H-level signal at one of the inputs thereof, the gate circuit 2 supplies the H-level signal to the level shift circuit 4 and the level shift circuit 4 supplies the H-level signal to the high-side transistor 3(1). As a result, the output signal HVO(1) from the output terminal 11(1) of the low-side drive circuit 8(1) shifts from the H level to the L level.

Next, at the time t3, the latch circuit 1*a*(2) supplies the H-level signal inputted from the latch circuit 1*a*(1) to the gate circuit 2 and to the low-side transistor 5(2), while supplying it to the terminal D of the latch circuit 1*a*(3).

The output signal HVO(2) from the output terminal 11(2) of the low-side drive circuit 8(2) shifts from the H level to the L level in the same manner as the shift in the output signal HVO(1) from the output terminal 11(1) of the low-side drive circuit 8(1).

Because the latch circuits 1*a*(1) to 1*a*(4*n*−3) composing the shift register 4 are connected in cascade, the output from each of the latch circuits 1*a* is sequentially shifted to the subsequent-stage latch circuit 1*a* with the timing coincident with the rising edge of the clock signal CLK so that the shift in each of the output signals HVO from the low-side drive circuits 8 is also sequentially shifted to the subsequent stage.

The high-side transistor 3(1) shown in FIG. 1 is shared by the low-side transistors 5(1), 5(5), and 5(4*n*−3). Accordingly, when any of the low-side transistors 5(1), 5(5), and 5(4*n*−3) is turned ON, a through current undesirably flows between the power source terminal 9 and the GND terminal 10 unless the high-side transistor 3(1) is turned OFF.

To prevent this, the resistors 121 are provided as the impedance element 12A between the power source terminal 9 and the output terminal 11 in the drive voltage supply circuit according to the first embodiment. In the arrangement, when the potential at any of the output terminals 11 is on a level other than the H level, a current is allowed to flow in the capacitive load 14 connected between the power source terminal 9 and the output terminal 11 until the output signal from the output terminal 11 shifts to the H level.

That is, in the drive voltage supply circuit according to the first embodiment, even when the potential at any of the output terminals 11 has oscillated during the HIZ period due to a disturbance resulting from capacitive coupling between wires or the like, the resistors 121 allows a current for compensating for the oscillation to flow.

A description will be given herein below to a circuit operation when the drive voltage supply circuit according to the first embodiment is applied to a real set circuit in the PDP shown in FIG. 13 described above.

Figure 13:
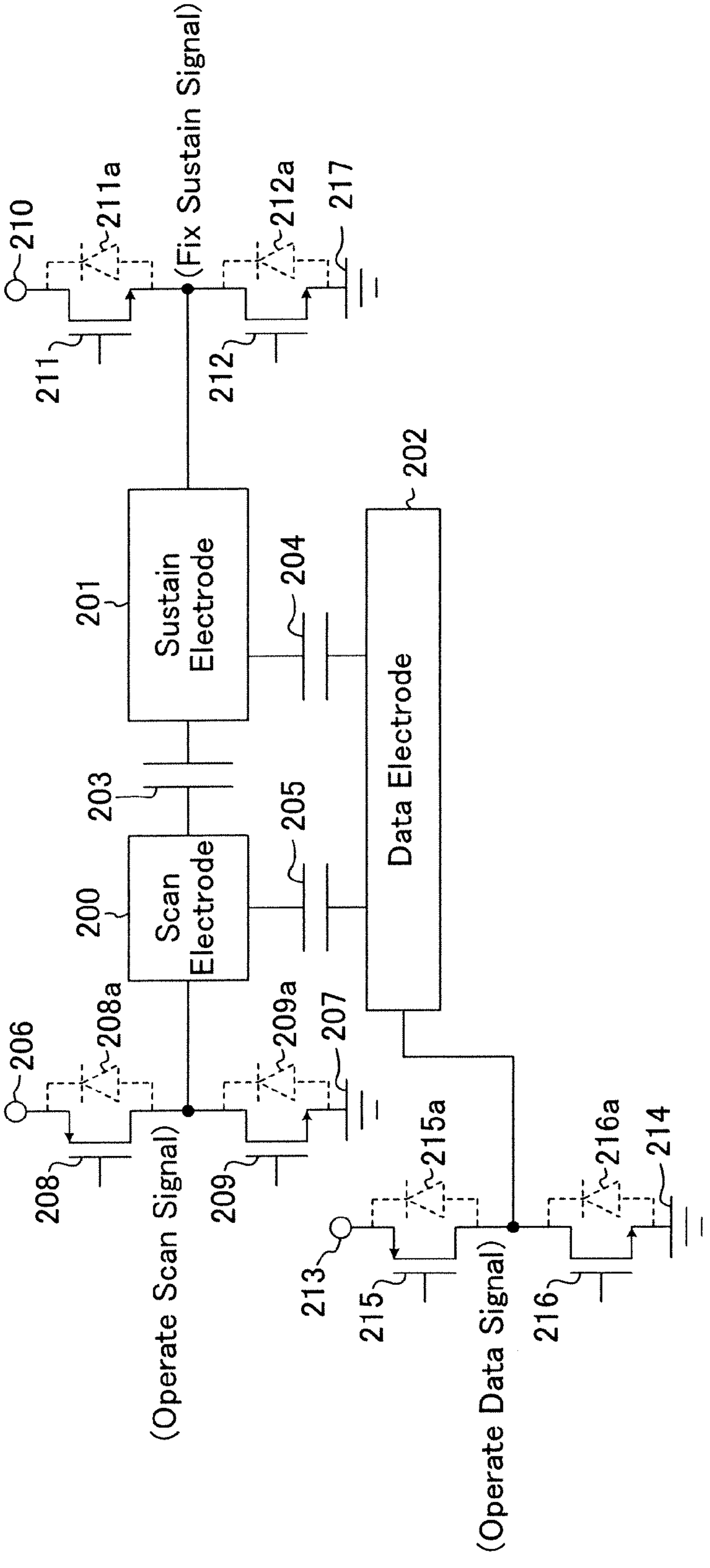
FIG. 13 PRIOR ART
FIG. 13 is an equivalent circuit diagram of a PDP panel.

FIG. 13 shows a real set circuit in the PDP in which the output load of each of the drivers is a capacitive load. To each of the output terminals 11 of FIG. 1, the scan electrode 200 of FIG. 13 corresponds. Each of the capacitive loads 14 of FIG. 1 corresponds to the capacitance 205 of FIG. 13.

Figure 4:
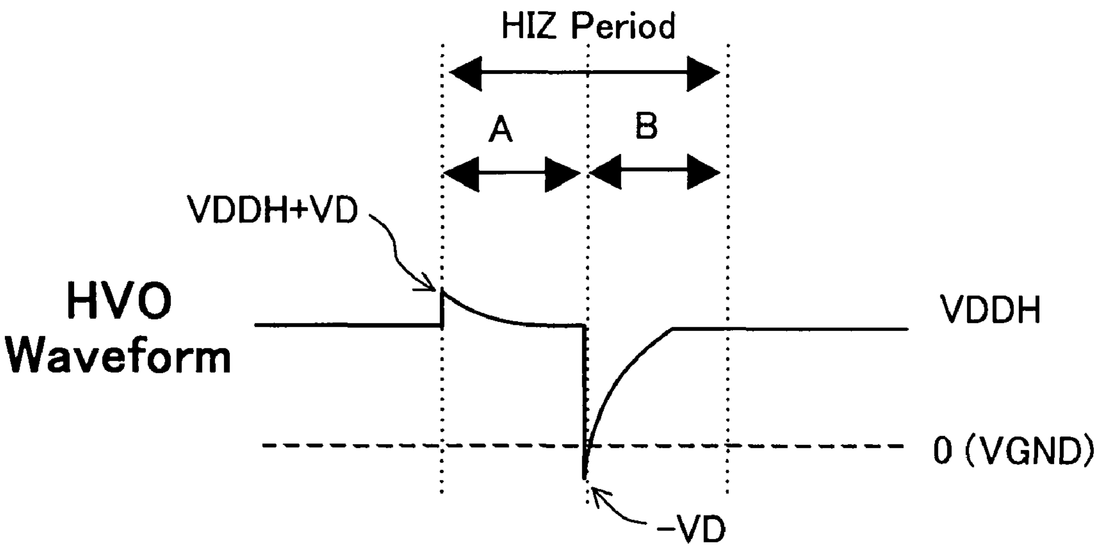
FIG. 4 is a view showing an improved oscillation in output potential in the first embodiment.
Figure 14:
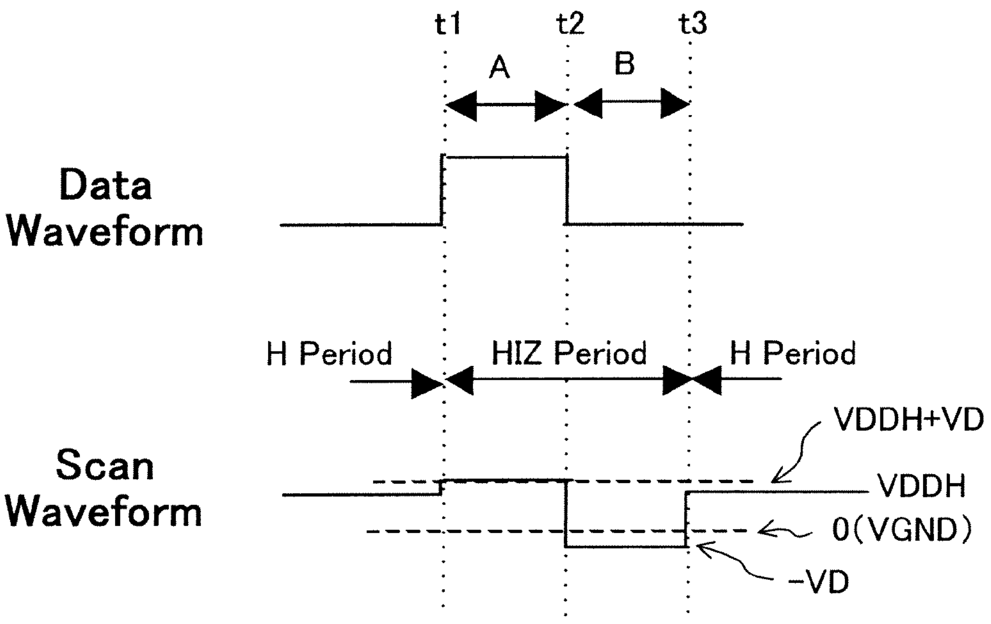
FIG. 14 PRIOR ART
FIG. 14 is a view of an oscillation in output potential for illustrating the problem to be solved.

As described above, the output potential oscillates in the conventional drive voltage supply circuit shown in FIG. 14 in such a manner that, once the output potential has oscillated under the influence of the data waveform, it holds the voltage thereof. By contrast, in the drive voltage supply circuit according to the first embodiment, the output potential oscillates in such a manner that it shows a differential waveform which instantaneously changes with the timing at which the data waveform shifts, as shown in FIG. 4. The peak value of the waveform is the same as in the conventional case but, unlike in the conventional embodiment, the waveform returns to the level VDDH within the HIZ period and is held.

Specifically, when the potential at the output terminal 11 (scan electrode 200 in FIG. 13) oscillates to a level of not less than the power source voltage (VDDH) due to a disturbance in the period A (specifically, it oscillates to the voltage (VDDH+VD) obtained by adding a forward voltage VD equivalent to a parasitic diode to the power source voltage (VDDH)) as shown in FIG. 4, the charge is transiently released from the capacitive load 14 (capacitance 205 in FIG. 13) due to the resistors 121 connected between the power source terminal 9 and the capacitive load 14 (the capacitance 205) so that the potential at the output terminal 11 (scan electrode 200) becomes equal to the potential at the power source terminal 9.

On the other hand, when the potential at the output terminal 11 (scan electrode 200) oscillates to a level of not more than the power source voltage (VDDH) due to a disturbance in the period B (specifically, it oscillates to the voltage (−VD) obtained by subtracting the forward voltage VD equivalent to the parasitic diode from the voltage VGND at the GND terminal 10) as shown in FIG. 4, the charge is transiently supplied from the capacitive load 14 (capacitance 205) due to the resistors 121 connected between the power source terminal 9 and the capacitive load 14 (the capacitance 205) so that the potential at the output terminal 11 (scan electrode 200) becomes equal to the potential at the power source terminal 9.

As can be obviously seen from the timing chart shown in FIG. 3, the output signal HVO from each of the output terminals 11 sequentially shifts to the L level and retains the H level during the period other than the period in which the output signal HVO from the output terminal 11 is on the L level.

It will also be understood that, during the period from the time t2 to the time t3, the output signal HVO (4*n*−3) from the output terminal (4*n*−3), which has been in the HIZ state in the conventional embodiment, retains the H level due to the resistors 121, while the output signal HVO(1) from the output terminal 11(1) remains on the L level.

When the high-side transistor 3(1) shown in FIG. 1 is turned ON, the H-level signal is outputted to each of the output terminal 11(1), the output terminal 11(5), and the output terminal 11(4*n*−3).

When the low-side transistor 5(1) is turned ON next, the high-side transistor 3(1) is turned OFF so that the output signal HVO(1) on the L level is outputted from the output terminal 11(1).

Since the diode 6(1) has been provided, the potential at the common terminal 13 shifts to the L level. However, since the diode 6(5) has been provided, the output signal HVO(5) from the output terminal 11(5) retains the H level.

At this time, each of the high-side transistor 3(1) and the low-side transistor 5(5) is OFF so that the output signal HVO (5) from the output terminal 11(5) is in the HIZ state in terms of the circuit structure. However, by extracting the current for charging or discharging the charge equivalent to the oscillation caused by the disturbance by using the resistors 121 described above, it is possible to implement a potential equal to the potential at the power source terminal 9, i.e., retain the H level and stabilize the potential at each of the output terminals 11.

Embodiment 2

A drive voltage supply circuit according to the second embodiment of the present invention is characterized in that a constant current source is provided between the power source terminal and the output terminals. As a result, when the potential at any of the capacitive loads connected to the output terminals is lower than the potential at the power source, a constant current is allowed to flow in the capacitive load. The arrangement suppresses an oscillation in the potential at each of the output terminals due to a disturbance when each of the high-side transistor and low-side transistors is OFF and the HIZ state occurs.

A specific description will be given herein below to the drive voltage supply circuit according to the second embodiment.

Figure 5:
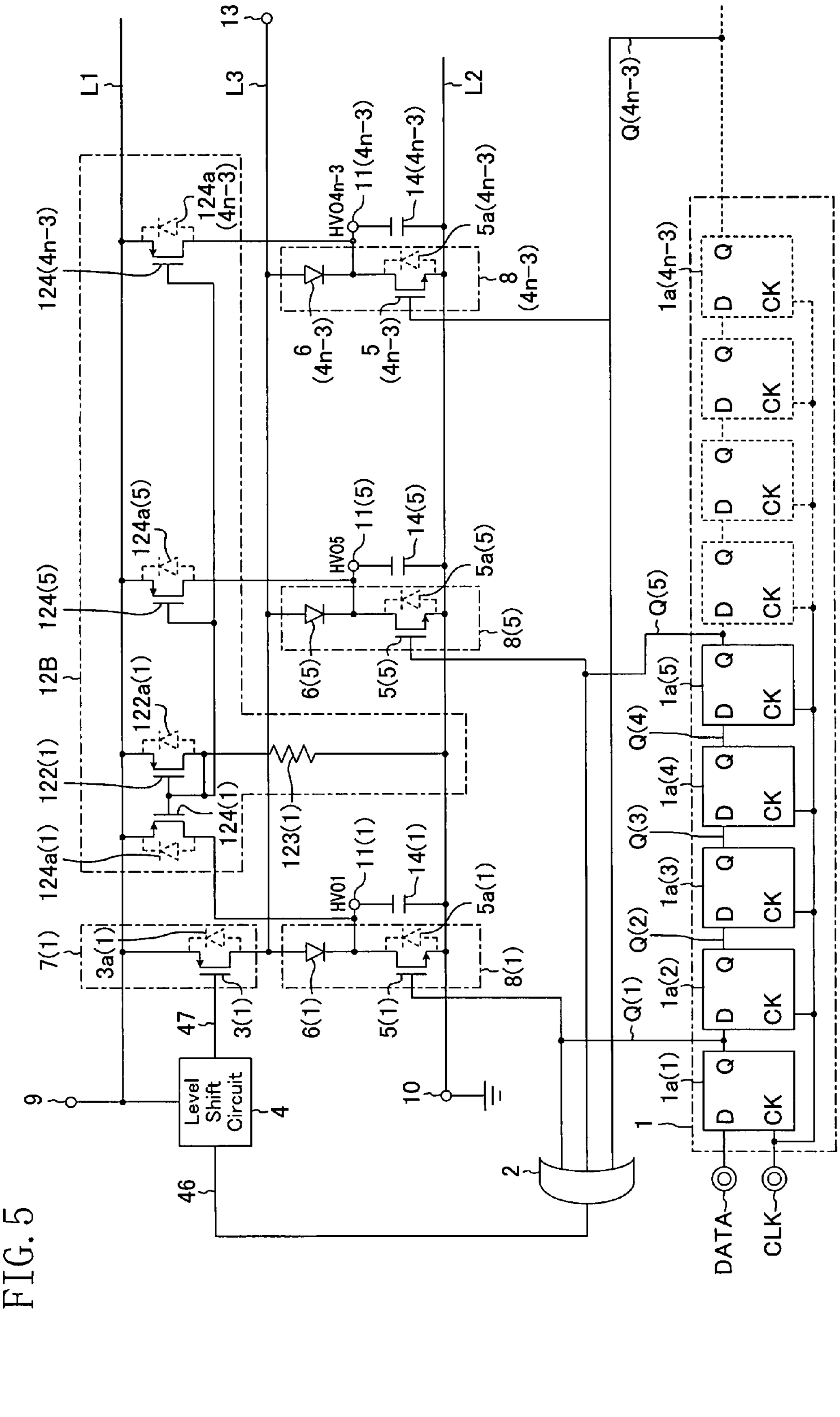
FIG. 5 is a circuit diagram showing a structure of a drive voltage supply circuit in a second embodiment of the present invention.

FIG. 5 shows a structure of the drive voltage supply circuit according to the second embodiment in a multi-channel semiconductor integrated circuit. For easy description of the operation, the connection of each of the capacitive loads 14 in FIG. 5 is shown as the connection of a typical capacitive load drive circuit and different from that of a real set circuit in the PDP shown in FIG. 13. In the drawing, n is an integer of not less than 2.

The drive voltage supply circuit shown in FIG. 5 comprises: the shift register 1 consisting of the plurality of latch circuits 1*a*; the gate circuit 2; the level shift circuit 4; the high-side drive circuit 7 composed of the high-side transistor 3; the low-side drive circuits 8 each composed of the low-side transistor 5 and the diode 6; the capacitive loads 14 connected to the output terminals 11 of the low-side drive circuits 8; and an impedance element 12B. In FIG. 5, the parasitic diodes 3*a* and 5*a* are shown individually for the high-side transistor 3 and the low-side transistors 5. The same components as shown in FIG. 1 used in the first embodiment described above are designated by the same reference numerals. The structures and operations of the individual components are the same as in the first embodiment and the description thereof will not be repeated.

The drive voltage supply circuit shown in FIG. 5 is different from the drive voltage supply circuit shown in FIG. 1 in the structure of the impedance element 12B.

As shown in FIG. 5, the impedance element 12B comprises: mirror circuits each composed of PMOS transistors 122 and 124; and resistors 123. Specifically, the PMOS transistors 122 and the resistors 123 are connected between the first wire line L1 and the third wire line L3. The PMOS transistors 124 are connected between the first wire line L1 and the output terminals 11. The PMOS transistors 122 and 124 compose each of the mirror circuits. In FIG. 5, parasitic diodes 122*a* and 124*a* are shown individually for the PMOS transistors 122 and 124. The denotation method for specifying the PMOS transistors 122 and 124, the parasitic diodes 122*a* and 124*a*, and the resistors 123 are the same as in the first embodiment described above.

When the potential at any of the capacitive loads 14 connected to the output terminals 11 is lower than the potential at the power source terminal 9, the structure of the impedance element 12B shown in FIG. 5 allows the constant current to flow between the power source terminal 9 and the output terminal 11. On the other hand, when the potential at each of the output terminals 11 is equal to the potential at the power source terminal 9, the drain-to-source voltages of the PMOS transistors 124 become equal so that the PMOS transistors 124 pinch OFF and the current no more flows between the power source terminal 9 and the output terminals 11.

A description will be given herein below to a circuit operation when the drive voltage supply circuit according to the second embodiment is applied to a real set circuit of the PDP shown in FIG. 13 described above.

FIG. 13 shows the real set circuit of the PDP in which the output load of each of the drivers is a capacitive load. To each of the output terminals 11 of FIG. 5, the scan electrode 200 of FIG. 13 corresponds. Each of the capacitive loads 14 of FIG. 5 corresponds to the capacitance 205 of FIG. 13.

Figure 6:
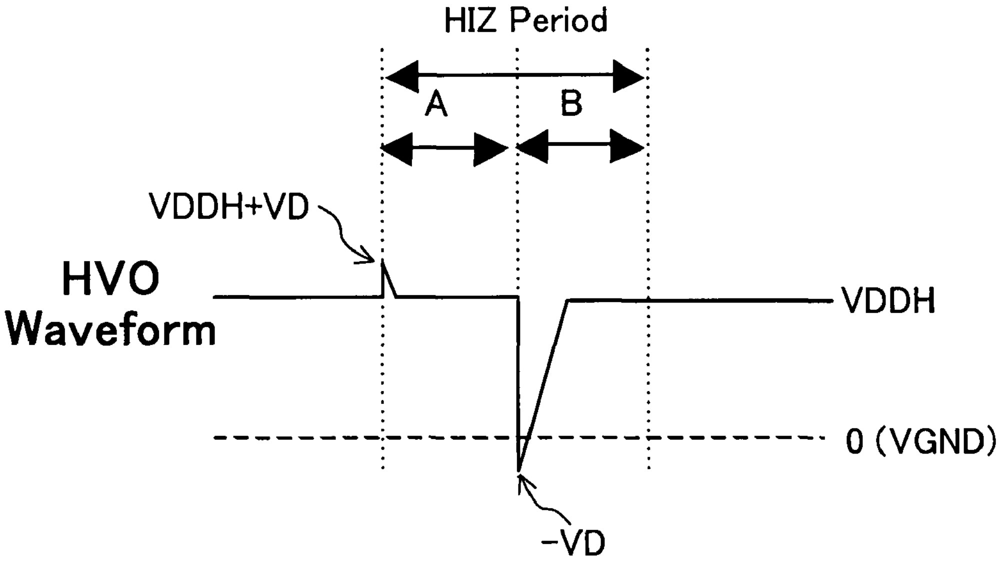
FIG. 6 is a view showing an improved oscillation in output potential in the second embodiment.

As described above, the output potential oscillates in the conventional drive voltage supply circuit shown in FIG. 14 in such a manner that, once the output potential has oscillated under the influence of the data waveform, it holds the voltage thereof. By contrast, in the drive voltage supply circuit according to the second embodiment, the output potential oscillates in such a manner that it shows a differential waveform which instantaneously changes with the timing at which the data waveform shifts, as shown in FIG. 6. The peak value of the waveform is the same as in the conventional case but, unlike in the conventional embodiment, the waveform returns to the level VDDH within the HIZ period and is held. In addition, the time required to return to the level VDDH within the HIZ period is shorter in the present embodiment than in the first embodiment described above (see FIG. 4) so that the effect of suppressing the oscillation in output potential is higher.

When the potential at the output terminal 11 (scan electrode 200 in FIG. 13) oscillates to a level of not less than the power source voltage (VDDH) due to a disturbance in the period A as shown in FIG. 6, the parasitic diode 124*a* of the PMOS transistor 124 which is present between the power source terminal 9 and the capacitive load 14 (the capacitance 205 in FIG. 13) is turned ON upon the application of the voltage (VDDH+VD) which is the sum of the voltage VDDH at the power source terminal 9 and a forward voltage VD equivalent to the parasitic diode 124*a* to the output terminal 11 (scan electrode 200) so that the potential at the output terminal 11 (scan electrode 200) is kept from rising to a level equal to or higher than the level obtained by adding the forward voltage VD to the potential at the power source terminal 9. Moreover, because the PMOS transistor 124 is ON, the potential at the output terminal 11 (scan electrode 200) becomes equal to the potential at the power source terminal 9 due to an ON-state resistance component.

On the other hand, when the potential at the output terminal 11 (scan electrode 200) oscillates to a level of not more than the power source voltage (VDDH) due to a disturbance in the period B as shown in FIG. 6, the capacitive load 14 (capacitance 205) is linearly charged by using the PMOS transistor 124 connected between the power source terminal 9 and the capacitive load 14 (the capacitance 205) to allow a constant current sufficient to compensate for the charge equivalent to the oscillation to flow so that the potential at the output terminal 11 (scan electrode 200) becomes equal to the potential at the power source terminal 9.

The timing chart according to the present embodiment becomes the same as in the description given with reference to FIG. 3 in the first embodiment. As can be obviously seen from FIG. 3, the output signal HVO from each of the output terminals 11 sequentially shifts to the L level and retains the H level during the period other than the period in which the output signal from the output terminal 11 is on the L level.

It will also be understood that, during the period from the time t2 to the time t3, the output signal HVO (4*n*−3) from the output terminal (4*n*−3), which has been in the HIZ state in the conventional embodiment, retains the H level due to the impedance element 12B, while the output signal HVO(1) from the output terminal 11(1) remains on the L level.

When the high-side transistor 3(1) shown in FIG. 5 is turned ON, the H-level signal is outputted to each of the output terminal 11(1), the output terminal 11(5), and the output terminal 11(4*n*−3).

When the low-side transistor 5(1) is turned ON next, the high-side transistor 3(1) is turned OFF so that the output signal HVO(1) on the L level is outputted from the output terminal 11(1).

Since the diode 6(1) has been provided, the potential at the common terminal 13 shifts to the L level. However, since the diode 6(5) has been provided, the output signal HVO(5) from the output terminal 11(5) retains the H level.

At this time, each of the high-side transistor 3(1) and the low-side transistor 5(5) is OFF so that the output signal HVO (5) from the output terminal 11(5) is in the HIZ state in terms of the circuit structure. However, by charging the capacitive load 14 with the current for charging or discharging the charge equivalent to the oscillation caused by the disturbance by using the impedance element 12B described above, it is possible to implement a potential equal to the potential at the power source terminal 9, i.e., retain the H level and stabilize the potential at each of the output terminals 11.

Embodiment 3

A drive voltage supply circuit according to the third embodiment of the present invention is characterized in that a constant current source controlled by switches is provided between the power source terminal and the output terminals. As a result, when the potential at any of the capacitive loads connected to the output terminals is lower than the potential at the power source and the potential at the output terminal is on the L level, a constant current is allowed to flow in the capacitive load. The arrangement suppresses an oscillation in the potential at each of the output terminals due to a disturbance when each of the high-side transistor and the low-side transistors is OFF and the HIZ state occurs, while efficiently supplying the current to the capacitive load during the period in which the oscillation in output potential is not desired.

A specific description will be given herein below to the drive voltage supply circuit according to the third embodiment.

Figure 7:
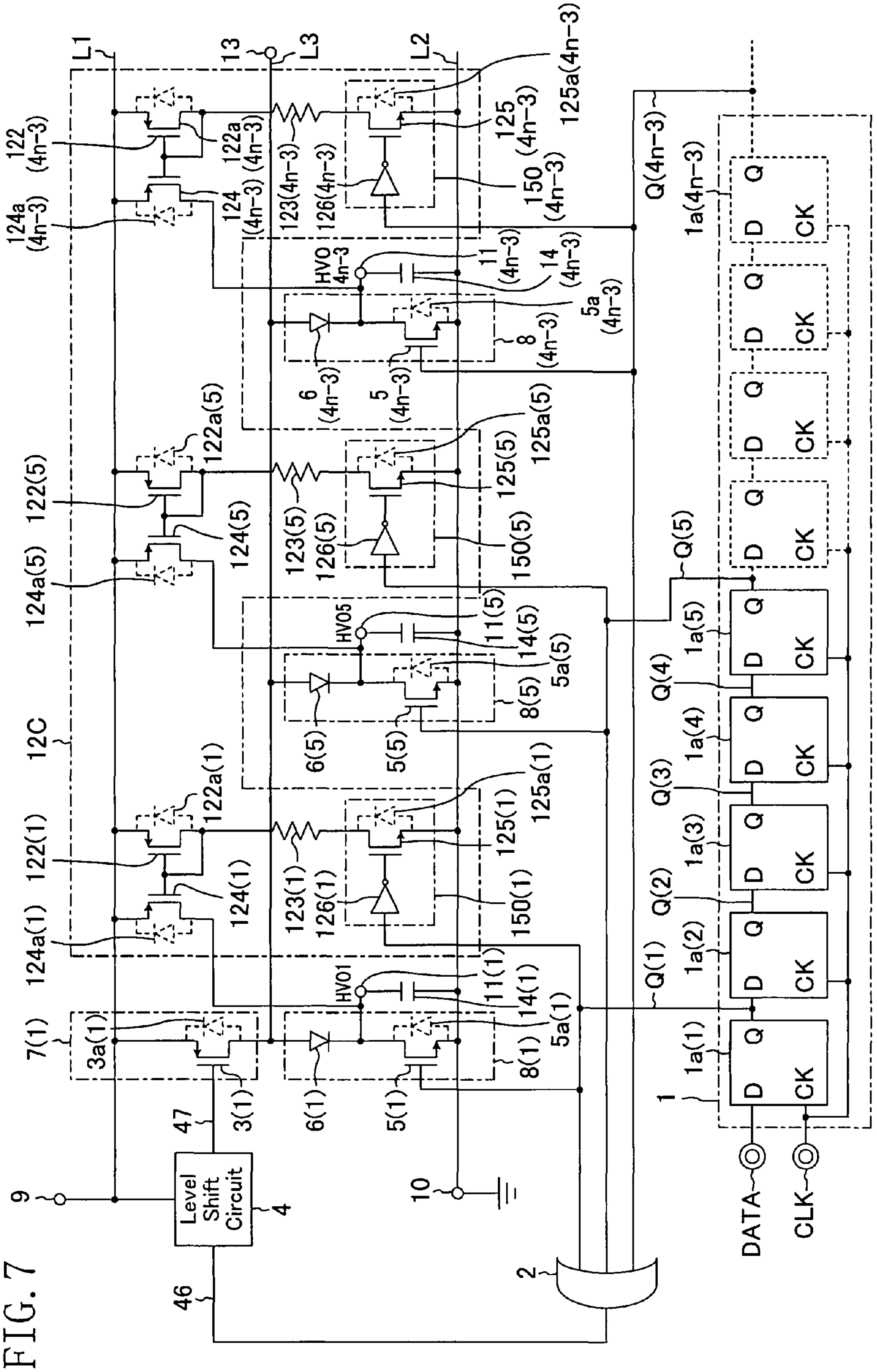
FIG. 7 is a circuit diagram showing a structure of a drive voltage supply circuit in a third embodiment of the present invention.

FIG. 7 shows a structure of the drive voltage supply circuit according to the third embodiment in a multi-channel semiconductor integrated circuit. In the drawing, n is an integer of not less than 2.

The drive voltage supply circuit shown in FIG. 7 comprises: the shift register 1 consisting of the plurality of latch circuits 1*a*; the gate circuit 2; the level shift circuit 4; the high-side drive circuit 7 composed of the high-side transistor 3; the low-side drive circuits 8 each composed of the low-side transistor 5 and the diode 6; the load capacitances 14 connected to the output terminals 11 of the low-side drive circuits 8; and an impedance element 12C. In FIG. 7, parasitic diodes 3*a* and 5*a* are shown individually for the high-side transistor 3 and the low-side transistors 5. The same components as shown in FIG. 1 used in the first embodiment described above are designated by the same reference numerals. The structures and operations of the individual components are the same as in the first embodiment and the description thereof will not be repeated.

The drive voltage supply circuit shown in FIG. 7 is different from the drive voltage supply circuit shown in FIG. 1 in the structure of the impedance element 12C.

As shown in FIG. 7, the impedance element 12C comprises: the mirror circuits composed of the PMOS transistors 122 and 124; the resistors 123; and analog switches 150. Specifically, the PMOS transistors 122, the resistors 123, and the analog switches 150 are connected in this order between the first wire line L1 and the third wire line L3. The analog switches 150 are composed of NMOS transistors 125 and inverters 126 for receiving the output signals Q from the latch circuits 1*a* and giving inverted signals thereof to the gates of the NMOS transistors 125. Accordingly, each of the analog switches 150 performs a switching operation in a phase opposite to that in which each of the low-side transistors 5 performs the operation. The PMOS transistors 124 are connected between the first wire line L1 and the output terminals 11. In FIG. 7, the parasitic diodes 122*a*, 124*a*, and 125*a* are shown individually for the PMOS transistors 122 and 124 and the NMOS transistors 125. The denotation method for specifying the PMOS transistors 122 and 124, the NMOS transistors 125, the parasitic diodes 122*a*, 124*a*, and 125*a*, the resistors 123, the inverters 126, and the analog switches 150 are the same as in the first embodiment described above.

A description will be given wherein below to the operation of the drive voltage supply circuit according to the third embodiment. For easy description of the operation, the connection of each of the capacitive loads 14 in FIG. 7 is shown as the connection of a typical capacitive load drive circuit and different from that of a real set circuit in the PDP shown in FIG. 13.

FIG. 3 used in the first embodiment described above is also a timing chart for illustrating an output operation in the third embodiment. The respective operation waveforms of an input signal 150S(1) to the analog switch 150(1), an input signal 150S(5) to the analog switch 150(5), and an input signal 150S(4*n*−3) to the analog switch 150(4*n*−3), which are shown in FIG. 3 in addition to the signals described above in the first embodiment, are specific to the present embodiment.

First, at the time t1, the data signal DATA is still on the L level (GND) so that the output signal Q from each of the latch circuits 1*a* corresponding to each of the high-side drive circuits 7 and each of the low-side drive circuits 8 is on the L level (GND). Accordingly, each of the low-side transistors 5 is in the OFF state and the high-side transistor 3 is in the ON state so that the output signal from each of the output terminals 11 is on the H level (power source voltage).

Next, when the data signal DATA shifts from the L level to the H level during the period between the times t1 and t2, the latch circuit 1*a*(1) supplies the data signal DATA on the H level to the gate circuit 2 and to the low-side transistor 5(1) with the timing at which the time t2 is reached, while supplying it to the terminal D of the latch circuit 1*a*(2) and further supplying it to the analog switch 150(1). In each of the analog switches 150, the signal inputted to the inverter 126 is inverted thereby and supplied to the NMOS transistor 125(1).

On receiving the H-level signal at one of the inputs thereof, the gate circuit 2 supplies the H-level signal to the level shift circuit 4 and the level shift circuit 4 supplies the H-level signal to the high-side transistor 3(1). As a result, the output signal HVO(1) from the output terminal 11(1) of the low-side drive circuit 8(1) shifts from the H level to the L level.

Next, at the time t3, the latch circuit 1*a*(2) supplies the H-level signal inputted from the latch circuit 1*a*(1) to the gate circuit 2 and to the low-side transistor 5(2), while supplying it to the terminal D of the latch circuit 1*a*(3).

The output signal HVO(2) from the output terminal 11(2) of the low-side drive circuit 8(2) shifts from the H level to the L level in the same manner as the shift in the output signal HVO(1) from the output terminal 11(1) of the low-side drive circuit 8(1).

Because the latch circuits 1*a*(1) to 1*a*(4*n*−3) composing the shift register 4 are connected in cascade, the output from each of the latch circuits 1*a* is sequentially shifted to the subsequent-stage latch circuit 1*a* with the timing coincident with the rising edge of the clock signal CLK so that the shift in each of the output signals HVO from the low-side drive circuits 8 is also sequentially shifted to the subsequent stage.

The high-side transistor 3(1) shown in FIG. 7 is shared by the low-side transistors 5(1), 5(5), and 5(4*n*−3). Accordingly, when any of the low-side transistors 5(1), 5(5), and 5(4*n*−3) is turned ON, a through current undesirably flows between the power source terminal 9 and the GND terminal 10 unless the high-side transistor 3(1) is turned OFF.

In the present embodiment, when the potential at any of the capacitive loads 14 connected to the output terminals 11 is lower than the potential at the power source terminal 9, the structure of the impedance element 12C shown in FIG. 7 allows the constant current to flow between the power source terminal 9 and the output terminal 11. On the other hand, when the potential at each of the output terminals 11 is equal to the potential at the power source terminal 9, the drain-to-source voltages of the PMOS transistors 124 become equal so that the PMOS transistor 124 pinch OFF and the current no more flows between the power source terminal 9 and the output terminal 11.

The present embodiment is different from the second embodiment described above in the following point. That is, in contrast to the impedance element 12B shown in FIG. 5 according to the second embodiment in which the current constantly flows between the power source terminal 9 and the GND terminal 10 when the output terminals 11 are on the L level and power consumption tends to increase, the impedance element 12C shown in FIG. 7 according to the present embodiment has the analog switches 150 which are connected between the power source terminal 9 and the GND terminal 10 and turned OFF when the output terminals 11 are on the L level. As a result, it is possible to suppress the current flowing between the power source terminal 9 and the GND terminal 10.

A description will be given herein below to a circuit operation when the drive voltage supply circuit according to the third embodiment is applied to a real set circuit of the PDP shown in FIG. 13 described above.

FIG. 13 shows the real set circuit of the PDP in which the output load of each of the drivers is a capacitive load. To each of the output terminals 11 of FIG. 7, the scan electrode 200 of FIG. 13 corresponds. Each of the capacitive loads 14 of FIG. 7 corresponds to the capacitance 205 of FIG. 13.

As described above, the output potential oscillates in the conventional drive voltage supply circuit shown in FIG. 14 in such a manner that, once the output potential has oscillated under the influence of the data waveform, it holds the voltage thereof. By contrast, in the drive voltage supply circuit according to the third embodiment, the output potential oscillates in such a manner that it shows a differential waveform which instantaneously changes with the timing at which the data waveform shifts, as shown in FIG. 6. The peak value of the waveform is the same as in the conventional case but, unlike in the conventional embodiment, the waveform returns to the level VDDH within the HIZ period and is held. In addition, the time required to return to the level VDDH within the HIZ period is shorter in the present embodiment than in the first embodiment described above (see FIG. 4) so that the effect of suppressing the oscillation in output potential is higher.

In the same manner as in the description given above with reference to FIG. 6, when the potential at the output terminal 11 (scan electrode 200 in FIG. 13) oscillates to a level of not less than the power source voltage (VDDH) due to a disturbance in the period A, the parasitic diode 124$a$ of the PMOS transistor 124 which is present between the power source terminal 9 and the capacitive load 14 (the capacitance 205 in FIG. 13) is turned ON upon the application of the voltage (VDDH+VD) which is the sum of the voltage VDDH at the power source terminal 9 and the forward voltage VD equivalent to the parasitic diode 124$a$ to the output terminal 11 (scan electrode 200) so that, in the present embodiment also, the potential at the output terminal 11 (scan electrode 200) is kept from rising to a level equal to or higher than the level obtained by adding the forward voltage VD to the potential at the power source terminal 9. Moreover, because the PMOS transistor 124 is ON, the potential at the output terminal 11 (scan electrode 200) becomes equal to the potential at the power source terminal 9 due to an ON-state resistance component. On the other hand, when the potential at the capacitive load 14 (capacitance 205) oscillates to a level of not more than the power source voltage (VDDH) due to a disturbance in the period B, the capacitive load 14 (capacitance 205) is linearly charged by using the PMOS transistor 124 connected between the power source terminal 9 and the capacitive load 14 (the capacitance 205) to allow a constant current sufficient to compensate for the charge equivalent to the oscillation to flow so that the potential at the output terminal 11 (scan electrode 200) becomes equal to the potential at the power source terminal 9.

As can be obviously seen from the timing chart shown in FIG. 3 which has been used in the present embodiment, the output signal HVO from each of the output terminals 11 sequentially shifts to the L level and retains the H level during the period other than the period in which the output signal HVO from the output terminal 11 is on the L level.

It will also be understood that, during the period from the time t2 to the time t3, the output signal HVO (4$n$−3) from the output terminal (4$n$−3), which has been in the HIZ state in the conventional embodiment, retains the H level due to the impedance element 12C, while the output signal HVO(1) from the output terminal 11(1) remains on the L level.

When the high-side transistor 3(1) shown in FIG. 7 is turned ON, the H-level signal is outputted to each of the output terminal 11(1), the output terminal 11(5), and the output terminal 11(4$n$−3).

When the low-side transistor 5(1) is turned ON next, the high-side transistor 3(1) is turned OFF so that the output signal HVO(1) on the L level is outputted from the output terminal 11(1).

Since the diode 6(1) has been provided, the potential at the common terminal 13 shifts to the L level. However, since the diode 6(5) has been provided, the output signal HVO(5) from the output terminal 11(5) retains the H level.

At this time, each of the high-side transistor 3(1) and the low-side transistor 5(5) is OFF so that the output signal HVO (5) from the output terminal 11(5) is in the HIZ state in terms of the circuit structure. However, by charging the capacitive load 14 with the current for charging or discharging the charge equivalent to the oscillation caused by the disturbance by using the impedance element 12C described above, it is possible to implement a potential equal to the potential at the power source terminal 9, i.e., retain the H level and stabilize the potential at each of the output terminals 11.

Embodiment 4

A drive voltage supply circuit according to the fourth embodiment of the present invention is characterized in that switches which are turned ON/OFF by level shift circuits are provided between the power source terminal and the output terminals. As a result, when the potential at any of the capacitive loads connected to the output terminals is lower than the potential at the power source, a large current is allowed to instantaneously flow in the capacitive load. The arrangement suppresses an oscillation in the potential at each of the output terminals due to a disturbance when each of the high-side transistor and the low-side transistors is OFF and the HIZ state occurs.

A specific description will be given herein below to the drive voltage supply circuit according to the fourth embodiment.

Figure 8:
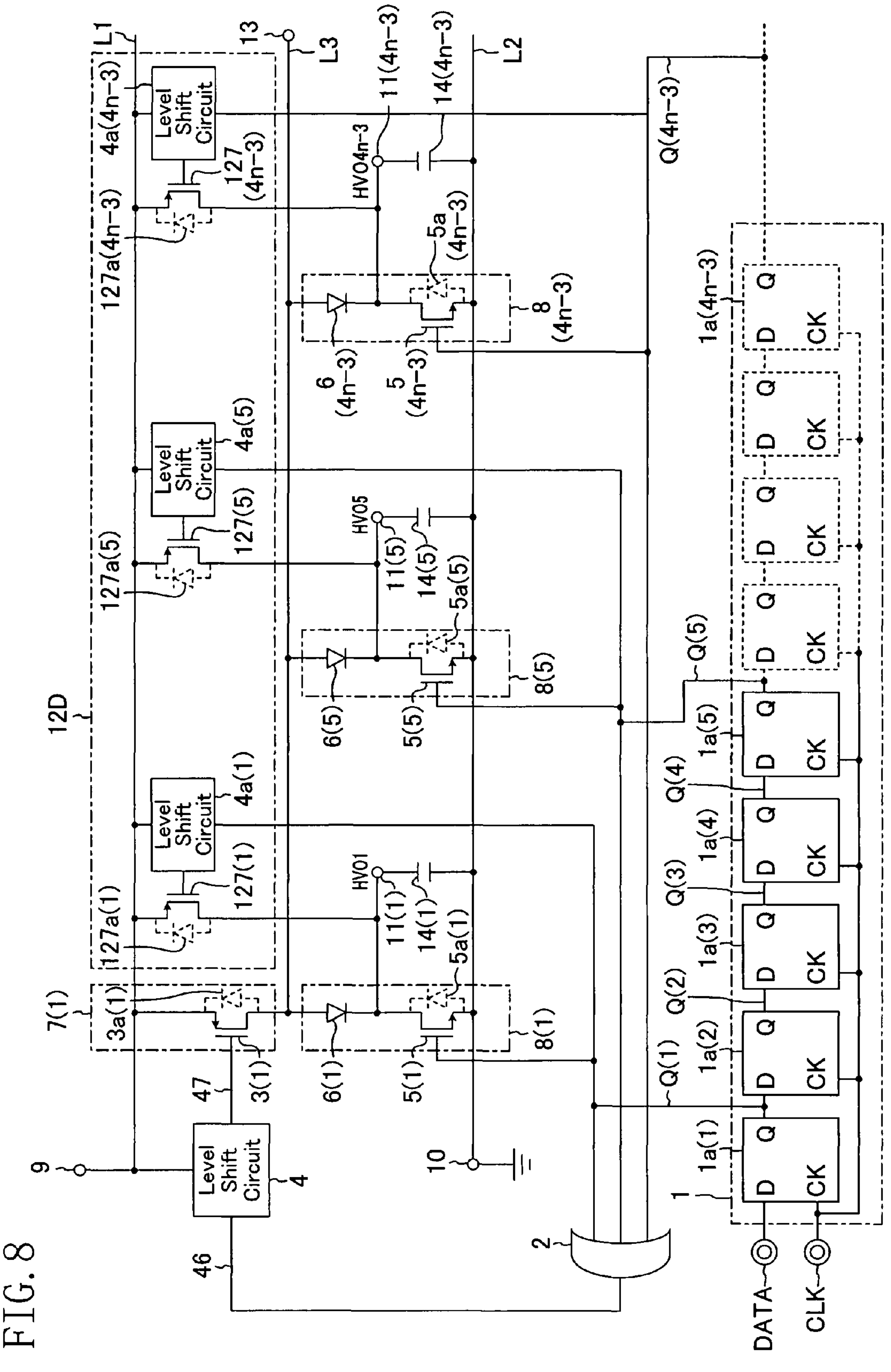
FIG. 8 is a circuit diagram showing a structure of a drive voltage supply circuit in a fourth embodiment of the present invention.

FIG. 8 shows a structure of the drive voltage supply circuit according to the fourth embodiment in a multi-channel semiconductor integrated circuit. In the drawing, n is an integer of not less than 2.

The drive voltage supply circuit shown in FIG. 8 comprises: the shift register 1 consisting of the plurality of latch circuits 1*a*; the gate circuit 2; the level shift circuit 4; the high-side drive circuit 7 composed of the high-side transistor 3; the low-side drive circuits 8 each composed of the low-side transistor 5 and the diode 6; the capacitive loads 14 connected to the output terminals 11 of the low-side drive circuits 8; and an impedance element 12D. In FIG. 8, parasitic diodes 3*a* and 5*a* are shown individually for the high-side transistor 3 and the low-side transistors 5. The same components as shown in FIG. 1 used in the first embodiment described above are designated by the same reference numerals.

The structures and operations of the individual components are the same as in the first embodiment and the description thereof will not be repeated.

The drive voltage supply circuit shown in FIG. 8 is different from the drive voltage supply circuit shown in FIG. 1 in the structure of the impedance element 12D.

As shown in FIG. 8, the impedance element 12D comprises: PMOS transistors 127 (high-side transistor); and level shift circuits 4*a*. Specifically, the PMOS transistors 127 are connected between the first wire line L1 and the third wire line L3. Each of the level shift circuits 4*a* connected to the first wire line L1 receives an output signal Q from the latch circuits and controls the corresponding PMOS transistor 127. Each of the level shift circuits 4*a* has the same structure as shown in, e.g., FIG. 2 described above. In FIG. 8, parasitic diodes 127*a* are shown for the PMOS transistors 127.

A description will be given herein below to the operation of the drive voltage supply circuit according to the fourth embodiment. For easy description of the operation, the connection of each of the capacitive loads 14 in FIG. 8 is shown as the connection of a typical capacitive load drive circuit and different from that of a real set circuit in the PDP shown in FIG. 13.

FIG. 3 used in the first embodiment described above is also a timing chart for illustrating an output operation in the fourth embodiment. The respective operation waveforms of an input signal 127S(1) to the PMOS transistor 127(1), an input signal 127S(5) to the PMOS transistor 127(5), and an input signal 127S(4*n*−1) to the PMOS transistor 127(4*n*−1), which are shown in FIG. 3 in addition to the signals described above in the first embodiment, are specific to the present embodiment.

First, at the time t1, the data signal DATA is still on the L level (GND) so that the output signal Q from each of the latch circuits 1*a* corresponding to each of the high-side drive circuits 7 and each of the low-side drive circuits 8 is on the L level (GND). Accordingly, each of the low-side transistors 5 is in the OFF state and the high-side transistors 3 is in the ON state so that the output signal from each of the output terminals 11 is on the H level (power source voltage).

Next, when the data signal DATA shifts from the L level to the H level during the period between the times t1 and t2, the latch circuit 1*a*(1) supplies the data signal DATA on the H level to the gate circuit 2 and to the low-side transistor 5(1) with the timing at which the time t2 is reached, while supplying it to the terminal D of the latch circuit 1*a*(2) and further supplying it to the level shift circuit 4*a*(1). Each of the level shift circuits 4 and 4*a* outputs a signal having the same phase as an input thereto and a voltage obtained by shifting the voltage of the input to the high-side transistor 3 and to the corresponding PMOS transistors 127.

On receiving the H-level signal at one of the inputs thereof, the gate circuit 2 supplies the H-level signal to the level shift circuit 4 and the level shift circuit 4 supplies the H-level signal to the high-side transistor 3(1). As a result, the output signal HVO(1) from the output terminal 11(1) of the low-side drive circuit 8(1) shifts from the H level to the L level.

Next, at the time t3, the latch circuit 1*a*(2) supplies the H-level signal inputted from the latch circuit 1*a*(1) to the gate circuit 2 and to the low-side transistor 5(2), while supplying it to the terminal D of the latch circuit 1*a*(3).

The output signal HVO(2) from the output terminal 11(2) of the low-side drive circuit 8(2) shifts from the H level to the L level in the same manner as the shift in the output signal HVO(1) from the output terminal 11(1) of the low-side drive circuit 8(1).

Because the latch circuits 1*a*(1) to 1*a*(4*n*−3) composing the shift register 4 are connected in cascade, the output from each of the latch circuits 1*a* is sequentially shifted to the subsequent-stage latch circuit 1*a* with the timing coincident with the rising edge of the clock signal CLK so that the shift in each of the output signals HVO from the low-side drive circuits 8 is also sequentially shifted to the subsequent stage.

The high-side transistor 3(1) shown in FIG. 8 is shared by the low-side transistors 5(1), 5(5), and 5(4*n*−3). Accordingly, when any of the low-side transistors 5(1), 5(5), and 5(4*n*−3) is turned ON, a through current undesirably flows between the power source terminal and the GND terminal 10 unless the high-side transistor 3(1) is turned OFF.

In the present embodiment, the structure of the impedance element 12D shown in FIG. 8 has turned ON the PMOS transistors 127 to prevent a situation in which each of the high-side transistor 3 and the low-side transistors 5 is turned OFF and the HIZ state occurs so that an ON-state resistance component is generated. Because the ON-state resistance component is a low resistance, when the potential at any of the capacitive loads 14 which are connected to the output terminals 11 is lower than the potential at the power source terminal 9, a large current is allowed to instantaneously flow between the power source terminal 9 and the output terminal 11. As a result, the potential at each of the output terminals 11 can be retained on the H level.

As is also obvious from the structure described above, the present embodiment is different from the third embodiment described above in the following point. That is, in contrast to the impedance element 12C shown in FIG. 7 according to the third embodiment in which the analog switches 150 are provided to prevent the current from flowing between the power source terminal 9 and the GND terminal 10 when the output terminals 11 are on the L level, the impedance element 12D shown in FIG. 8 according to the present embodiment has the level shift circuits 4*a* for turning ON/OFF the PMOS transistors 127 which are provided between the power source terminal 11 and the GND terminal 10.

A description will be given herein below to a circuit operation when the drive voltage supply circuit according to the fourth embodiment is applied to a real set circuit of the PDP shown in FIG. 13 described above.

FIG. 13 shows the real set circuit of the PDP in which the output load of each of the drivers is a capacitive load. To each of the output terminals 11 of FIG. 8, the scan electrode 200 of FIG. 13 corresponds. Each of the capacitive loads 14 of FIG. 8 corresponds to the capacitance 205 of FIG. 13.

Figure 9:
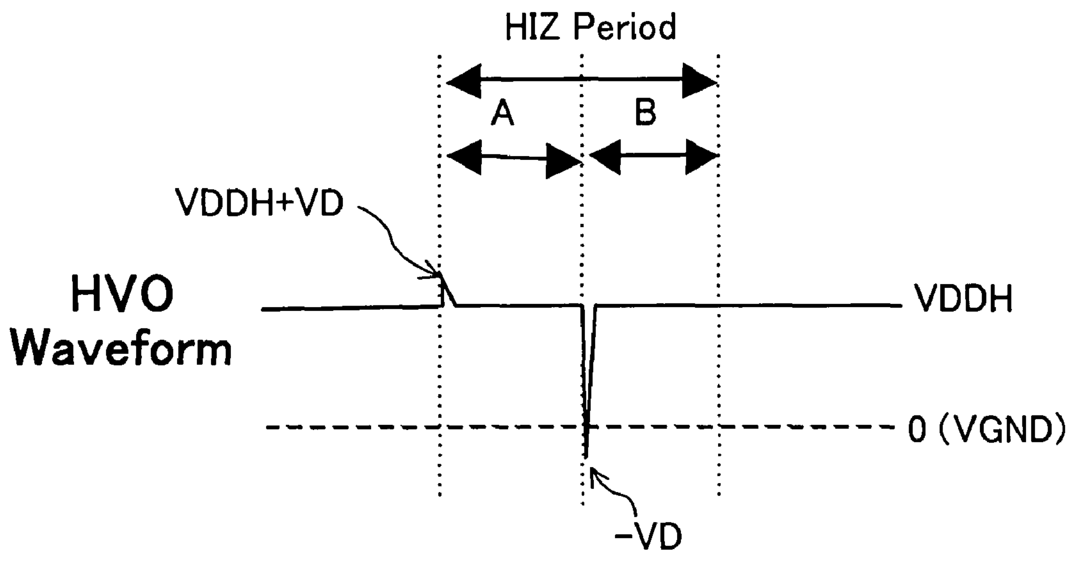
FIG. 9 is a view showing an improved oscillation in output potential in the fourth embodiment.

As described above, the output potential oscillates in the conventional drive voltage supply circuit shown in FIG. 14 in such a manner that, once the output potential has oscillated under the influence of the data waveform, it holds the voltage thereof. By contrast, in the drive voltage supply circuit according to the fourth embodiment, the output potential oscillates in such a manner that it shows a differential waveform which instantaneously changes with the timing at which the data waveform shifts, as shown in FIG. 9. The peak value of the waveform is the same as in the conventional case but, unlike in the conventional embodiment, the waveform returns to the level VDDH within the HIZ period and is held. In addition, the time required to return to the level VDDH within the HIZ period is shorter in the present embodiment than in the first, second, and third embodiments described above so that the effect of suppressing the oscillation in output potential is higher.

As shown in FIG. 9, when the potential at the output terminal 11 (scan electrode 200 in FIG. 13) oscillates to a level of not less than the power source voltage (VDDH) due to a disturbance in the period A, the parasitic diode 127*a* of the PMOS transistor 127 which is present between the power source terminal 9 and the capacitive load 14 (the capacitance 205 in FIG. 13) is turned ON upon the application of the voltage (VDDH+VD) which is the sum of the voltage VDDH at the power source terminal 9 and the forward voltage VD equivalent to the parasitic diode 127*a* to the output terminal 11 (scan electrode 200) so that the potential at the output terminal 11 (scan electrode 200) is kept from rising to a level equal to or higher than the level obtained by adding the forward voltage VD to the potential at the power source terminal 9. Moreover, because the PMOS transistor 127 is ON, the potential at the output terminal 11 (scan electrode 200) becomes equal to the potential at the power source terminal 9 due to the ON-state resistance component.

On the other hand, when the potential at the output terminal 11 (scan electrode 200) oscillates to a level of not more than the power source voltage (VDDH) due to a disturbance in the period B as shown in FIG. 9, the capacitive load 14 (capacitance 205) is instantaneously supplied with the charge equivalent to the oscillation by using the PMOS transistor 127 connected between the power source terminal 9 and the capacitive load 14 (the capacitance 205) so that the potential at the output terminal 11 (scan electrode 200) becomes equal to the potential at the power source terminal 9.

As can be obviously seen from the timing chart shown in FIG. 3 which has been used in the present embodiment, the output signal HVO from each of the output terminals 11 sequentially shifts to the L level and retains the H level during the period other than the period in which the output signal HVO from the output terminal 11 is on the L level.

It will also be understood that, during the period from the time t2 to the time t3, the output signal HVO (4*n*−3) from the output terminal (4*n*−3), which has been in the HIZ state in the conventional embodiment, retains the H level due to the impedance elements 12D, while the output signal HVO(1) from the output terminal 11(1) remains on the L level.

When the high-side transistor 3(1) shown in FIG. 8 is turned ON, the H-level signal is outputted to each of the output terminal 11(1), the output terminal 11(5), and the output terminal 11(4*n*−3).

When the low-side transistor 5(1) is turned ON next, the high-side transistor 3(1) is turned OFF so that the output signal HVO(1) on the L level is outputted from the output terminal 11(1).

Since the diode 6(1) has been provided, the potential at the common terminal 13 shifts to the L level. However, since the diode 6(5) has been provided, the output signal HVO(5) from the output terminal 11(5) retains the H level.

At this time, each of the high-side transistor 3(1) and the low-side transistor 5(5) is OFF. However, by instantaneously charging the capacitive load 14 with the large current for charging or discharging the charge equivalent to the oscillation caused by the disturbance by using the impedance element 12D described above, it is possible to implement a potential equal to the potential at the power source terminal 9, i.e., retain the H level and stabilize the potential at each of the output terminals 11 without producing the HIZ state.

Embodiment 5

A specific description will be given herein below to a drive voltage supply circuit according to the fifth embodiment.

Figure 10:
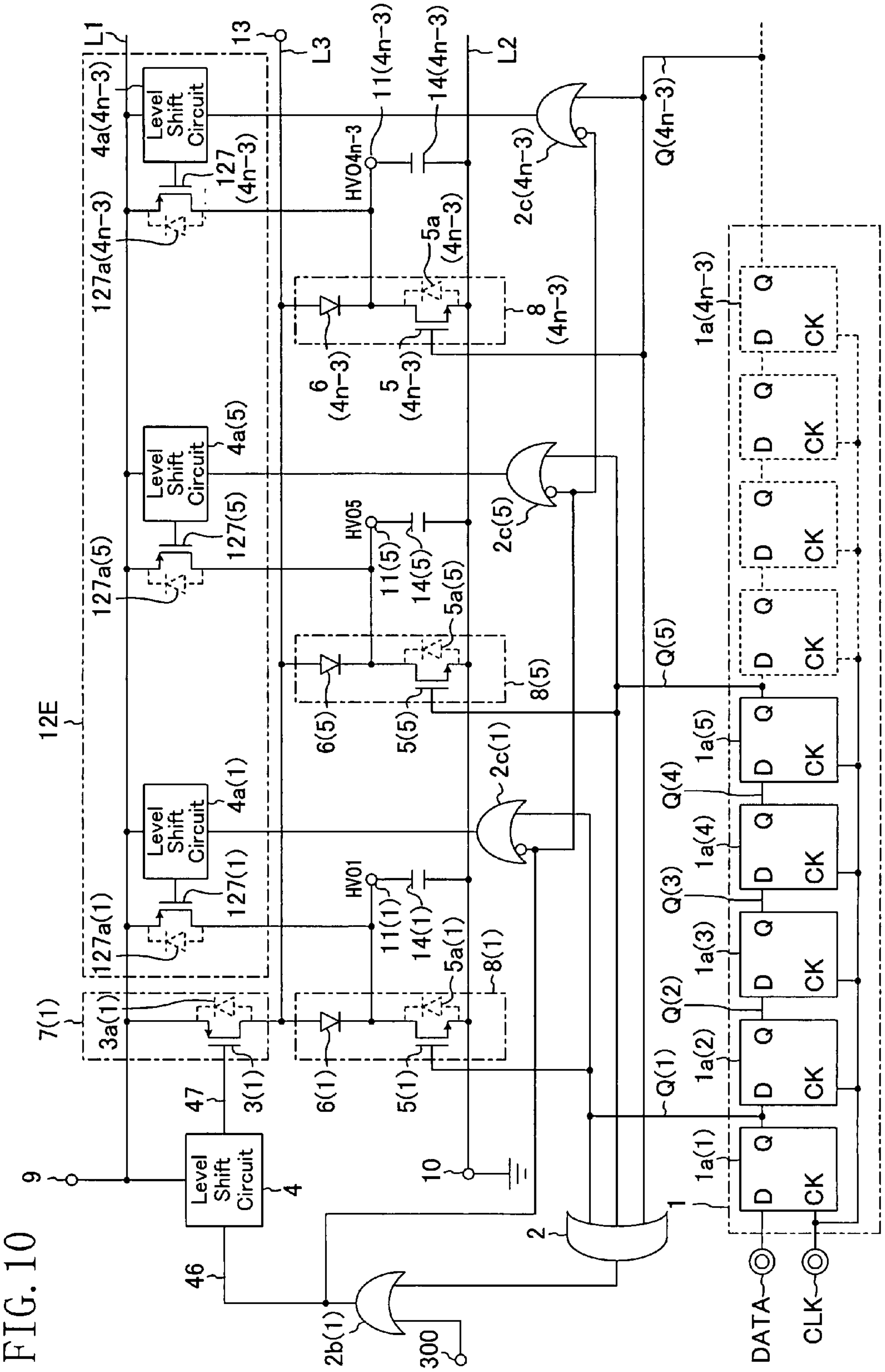
FIG. 10 is a circuit diagram showing a structure of a drive voltage supply circuit in a fifth embodiment of the present invention.

FIG. 10 shows a structure of the drive voltage supply circuit according to the fifth embodiment in a multi-channel semiconductor integrated circuit. In the drawing, n is an integer of not less than 2.

The drive-voltage supply circuit shown in FIG. 10 comprises: a shift register 1 consisting of a plurality of latch circuits 1*a*; gate circuits 2*b* and 2*c*; a level shift circuit 4; a high-side drive circuit 7 composed of a high-side transistor 3; low-side drive circuits 8 each composed of a low-side transistor 5 and a diode 6; capacitive loads 14 connected to the output terminals 11 of the low-side drive circuits 8; and an impedance element 12E. A control input terminal 300 is connected to one terminal of the gate circuit 2*b*. In FIG. 10, parasitic diodes 3*a* and 5*a* are shown individually for the high-side transistor 3 and the low-side transistors 5. The same components as shown in FIG. 1 used in the first embodiment described above are designated by the same reference numerals. The structures and operations of the individual components are the same as in the first embodiment and the description thereof will not be repeated.

The impedance element 12E is the same as shown above in FIG. 8 and comprises: PMOS transistors (high-side transistor) 127; and level shift circuits 4*a*. Specifically, the PMOS transistors 127 are connected between the first wire line L1 and the third wire line L3. Each of the level shift circuits 4*a* connected to the first wire line L1 receives a signal from the gate circuit 2*c* and controls the corresponding PMOS transistor 127. Each of the level shift circuits 4*a* has the same structure as shown in, e.g., FIG. 2 described above. In FIG. 8, parasitic diodes 127*a* are shown for the PMOS transistors 127.

In the same manner as in the conventional embodiment, output signals Q which are sequentially outputted from the latch circuits 1*a*(1) to 1*a*(4*n*−3) each composing the shift register 1 are inputted to the gate circuit 2. A signal outputted from the gate circuit 2 is inputted to the level shift circuit 4. A signal outputted from the level shift circuit 4 controls the high-side transistor 3. The input signals 1*a*(a) to 1*a*(4*n*−3) which are sequentially outputted from the shift register 1 control the low-side transistors 5(1) to 5(4*n*−3) and switch the states at the output terminals 11 by the control states of the high-side transistor 3 and the low-side transistors 5.

The output signal from the gate circuit 2 shifts to the L level when each of the inputs is on the L level. In this case, the output from each of the output terminals 11(1), 11(5), and 11(4*n*−3) shifts to the H level.

In this case, when a L-level signal is inputted to the control input terminal 300, the gate circuit 2*b*(1) outputs the L-level signal to turn ON the high-side transistor 3(1) via the level shift circuit 4. This charges the capacitive loads 14 connected to the respective output terminals and brings the terminal voltage to the H level.

On the other hand, when a H-level signal is inputted to the control input terminal 300, the gate circuit 2*b*(1) outputs the H-level signal so that the high-side transistor 3(1) is not turned ON but each of gate circuits 2*c*(1), 2*c*(5), and 2*c*(4*n*−3) that has received the output signal from the gate circuit 2*b*(1) outputs the L-level signal since each of the inputs to the gate circuits 2 is on the L level. As a result, high-side transistors 127(1), 127(5), and 127(4*n*−3) are turned ON via the level shift circuits 4*a*(1), 4*a*(5), and 4*a*(4*n*−3) so that a capacitance load 83 is charged to bring the terminal voltage to the H level (power source), Preferably, the ability of each of the high-side transistors 127(1), 127(5), and 127(4*n*−3) connected to the respective output terminals 11 is adjusted to be lower than that of the high-side transistor 3(1). As a result, even when any of the output terminals 11 incurs an abnormal operation such as power dissipation from the capacitance and the terminal voltage is forcibly brought to the same potential at the output terminal 11, i.e., brought into the grounded state, by bringing the input terminal 300 to the H level and using the PMOS transistor 127 having the low ability, a through current flowing between a ground point and the power source terminal can be suppressed to be smaller in amount than in the case where the high-side transistor 3 having the high ability is used.

In the drive-voltage supply circuit according to the fifth embodiment described above, the connection of each of the capacitive loads 14 in FIG. 10 is shown as the connection of a typical capacitive load drive circuit for easy description of the operation. However, the fifth embodiment is applicable to a real set circuit in the PDP shown in FIG. 13 as described above in each of the first to fifth embodiments.

Embodiment 6

A specific description will be given herein below to a drive voltage supply circuit according to the sixth embodiment.

Figure 11:
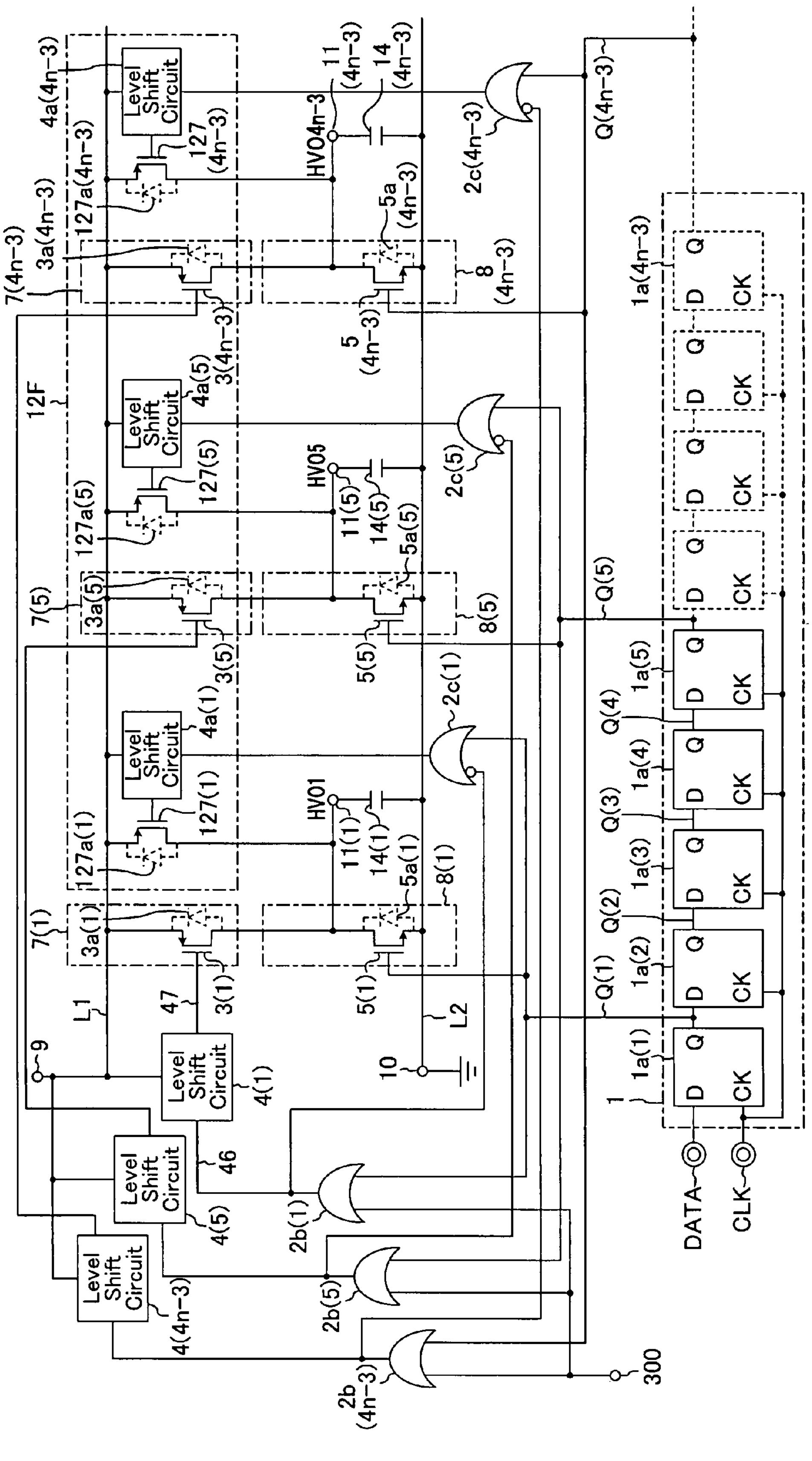
FIG. 11 is a view showing an improved oscillation in output potential in a sixth embodiment of the present invention.
Figure 12:
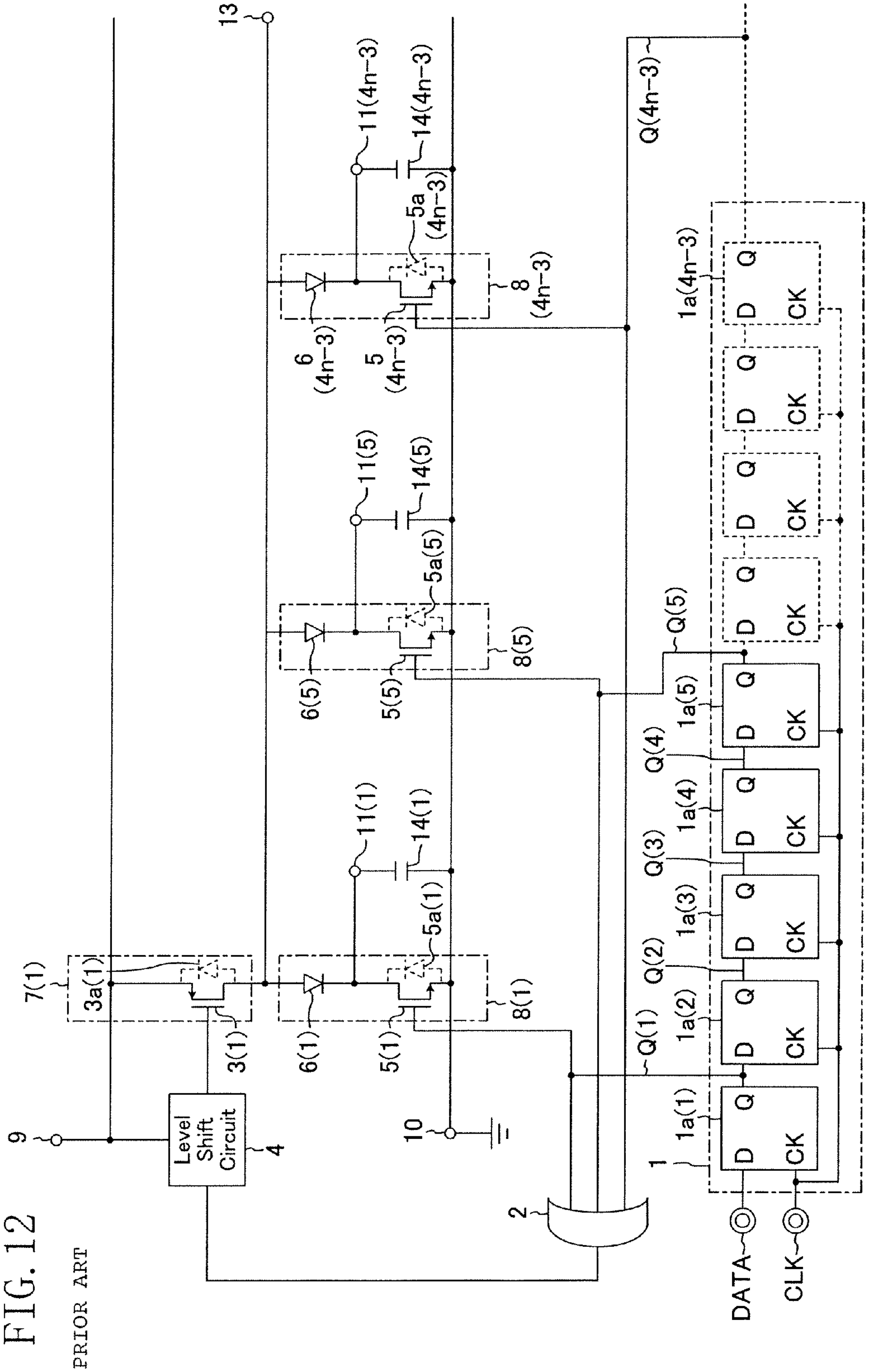
FIG. 12 PRIOR ART
FIG. 12 is a circuit diagram showing a structure of a conventional drive voltage supply circuit.

FIG. 11 shows a structure of the drive voltage supply circuit according to the sixth embodiment in a multi-channel semiconductor integrated circuit. In the drawing, n is an integer of not less than 2.

The drive-voltage supply circuit shown in FIG. 11 comprises: a shift register 1 consisting of a plurality of latch circuits 1*a*; gate circuits 2*b* and 2*c*; level shift circuits 4 and 4*a*, high-side drive circuits 7 each composed of a high-side transistor 3; low-side drive circuits 8 each composed of a low-side transistor 5; capacitive loads 14 connected to the output terminals 11 of the low-side drive circuits 8; and an impedance element 12F.

In the present embodiment, it is not that the single high-side transistor 3 is shared by the respective output terminals of the low-side transistor circuits 8, but that the plurality of high-side transistors 3 are provided for the respective output terminals of the low-side drive circuits 8 on a one-to-one basis. A control input terminal 300 for the plurality of low-side transistors is connected to one terminal of the gate circuit 2*b*. In FIG. 11, parasitic diodes 3*a* and 5*a* are shown individually for the high-side transistor 3 and the low-side transistors 5. The same components as shown in FIG. 1 used in the first embodiment described above are designated by the same reference numerals. The structures and operations of the individual components are the same as in the first embodiment and the description thereof will not be repeated.

The impedance element 12F is the same as shown above in FIG. 8 and comprises: PMOS transistors 127; and level shift circuits 4*a*. Specifically, the PMOS transistors 127 are connected between the first wire line L1 and the third wire line L3. Each of the level shift circuits 4*a* connected to the first wire line L1 receives a signal from the gate circuit 2*c* and controls the corresponding PMOS transistor 127. Each of the level shift circuits 4*a* has the same structure as shown in, e.g., FIG. 2 described above. In FIG. 11, parasitic diodes 127*a* are shown for the PMOS transistors 127.

The drive voltage supply circuit according to the present embodiment is different from the drive voltage supply circuit according to the foregoing fifth embodiment in that it does not have the diode for preventing a back flow because the high-side transistor 3 is not shared, as described above, and each of the output terminals 11 has the pair of high-side transistors (3, 127).

The operation of the drive voltage supply circuit according to the present embodiment is the same as that of the drive-voltage supply circuit according to the fifth embodiment. The control input terminal 300 allows selection between the outputs from the high-side transistors (3, 127) connected to the respective outputs terminals 11. As a result, it is possible to suppress a through current when the outputs are brought into the grounded state by power dissipation from the load capacitances 14 connected thereto or the like in the same manner as in the fifth embodiment described above.

In the drive-voltage supply circuit according to the sixth embodiment described above, the connection of each of the capacitive loads 14 in FIG. 10 is shown as the connection of a typical capacitive load drive circuit for easy description of the operation. However, the sixth embodiment is applicable to a real set circuit in the PDP shown in FIG. 13 as described above in each of the first to fourth embodiments.

Each of the foregoing embodiments has described the case where the drive voltage supply circuit selectively provides the outputs Q(1), Q(5), . . . Q (4*n*−3), . . . from every fourth latch circuits by skipping the outputs from the three latch circuits therebetween. However, the same effects as described above can also be obtained in the sixth embodiment even in the case where the drive voltage supply circuit sequentially provides the outputs Q(1), Q(2), Q(3), . . . .

The present invention is usable for a drive circuit in a multi-channel semiconductor integrated circuit for driving a capacitive load such as a PDP.

What is claimed is:

1. A drive voltage supply circuit comprising:

a first wire line supplied with a first potential;

a second wire line supplied with a second potential;

a first drive circuit having a first transistor connected between the first wire line and a third wire line;

a plurality of second drive circuits each connected between the second wire line and the third wire line and having a diode and a second transistor which are connected in series as well as an output terminal connected to a common connection node between the diode and the second transistor;

a control circuit for driving the first drive circuit and the plurality of second drive circuits; and a third transistor connected between the first wire line and the output terminal and composing a current source for supplying a current to each of the output terminals, wherein the third transistor is driven by the control circuit.

2. The drive voltage supply circuit of claim 1, further comprising:

a MOS transistor provided between the first wire line and the second wire line to perform a switching operation in a phase opposite to a phase of a signal for driving the second drive circuit.

3. The drive voltage supply circuit of claim 2 further comprising:

a selection circuit for performing a switching operation using an external input to prevent a transistor composing the first drive circuit and at least one of the MOS transistors composing the current source from being simultaneously turned ON.

4. A drive voltage supply circuit comprising:

a first wire line supplied with a first potential;

a second wire line supplied with a second potential;

a first drive circuit having a first transistor connected between the first wire line and a third wire line;

a plurality of second drive circuits each connected between the second wire line and the third wire line and having a diode and a second transistor which are connected in series as well as an output terminal connected to a common connection node between the diode and the second transistor:

a control circuit for driving the first drive circuit and the plurality of second drive circuits; and a third transistor connected between the first wire line and the output terminal and composing a switch configured to control current supply to the output terminal, wherein the third transistor is driven by the control circuit.

* * * * *